United States Patent

Ootsuki et al.

[11] Patent Number: 6,130,845
[45] Date of Patent: *Oct. 10, 2000

[54] DYNAMIC TYPE SEMICONDUCTOR MEMORY DEVICE HAVING FUNCTION OF COMPENSATING FOR THRESHOLD VALUE

[75] Inventors: Tetsuya Ootsuki; Isao Naritake, both of Tokyo, Japan

[73] Assignee: NEC Corporation, Tokyo, Japan

[ * ] Notice: This patent is subject to a terminal disclaimer.

[21] Appl. No.: 09/161,954

[22] Filed: Sep. 29, 1998

[30] Foreign Application Priority Data

Sep. 29, 1997 [JP] Japan .................................. 9-264074

[51] Int. Cl.$^7$ ...................................................... G11C 7/00
[52] U.S. Cl. ............................ 365/190; 365/51; 365/149; 365/205
[58] Field of Search .............................. 365/190, 51, 149, 365/205, 114, 189.01

[56] References Cited

U.S. PATENT DOCUMENTS 5,353,255 10/1994 Komuro .................................. 365/208
5,430,672 7/1995 Kuwabara et al. ...................... 365/149
5,515,315 5/1996 Uda et al. ............................... 365/174

FOREIGN PATENT DOCUMENTS 3-16049  1/1991  Japan .
4-219698 8/1992  Japan .

*Primary Examiner*—David Nelms
*Assistant Examiner*—Hoai V. Ho
*Attorney, Agent, or Firm*—Foley & Lardner

[57] ABSTRACT

There is provided a dynamic type semiconductor memory device including (a) a first hierarchized complementary bit line, (b) a second hierarchized complementary bit line, (c) a first sense-amplifier electrically connected to the first bit line, (d) at least one second sense-amplifier electrically connected to both the first bit line and the second bit line, (e) a capacitor located between the first and second bit lines for each of second sense-amplifiers, and (f) a transfer gate arranged in series with the capacity between the first and second bit lines. The above-mentioned dynamic type semiconductor memory device makes it possible to store two-bit data in a single memory cell by employing a memory cell comprised of one transistor and one capacitor, without the use of a conventional memory cell having two transistors and one capacitor. Hence, the dynamic type semiconductor memory device ensures a significant reduction in a chip area.

22 Claims, 21 Drawing Sheets

DYNAMIC TYPE SEMICONDUCTOR MEMORY DEVICE HAVING FUNCTION OF COMPENSATING FOR THRESHOLD VALUE

BACKGROUND OF THE INVENTION

1. Field of the Invention

The invention relates to a dynamic type semiconductor memory device such as dynamic random access memory (DRAM), and more particularly to a dynamic type semiconductor memory device including a sense-amplifier having a function of compensating for a threshold value, and being capable of storing a plurality of bit data in a single memory cell.

2. Description of the Related Art

In these days, many techniques have been developed in order to enhance integration and capacity in a dynamic type semiconductor memory device. For instance, Japanese Unexamined Patent Publication No. 3-16049 has suggested a memory device including three devices, that is, two transistors and one capacitor having the same storage capacitance as that of a conventional one, and storing two-bit data. Namely, one bit corresponds to 1.5 devices in this memory device.

FIG. 1 is a circuit diagram of a circuit constituting the semiconductor memory device suggested in the above-mentioned Japanese Unexamined Patent Publication No. 3-16049, FIG. 2 illustrates waveforms of input signals in the circuit illustrated in FIG. 1, and FIGS. 3 and 4 illustrate waveforms of a voltage found when a bit line is to be read.

As illustrated in FIG. 1, the illustrated circuit includes a memory cell 20 having two transistors and one capacitor to store two-bit data therein, a storage capacitor 21, transfer gates 23 and 24 connected in series to the storage capacitor 21 for reading data stored in the storage capacitor 21 onto a bit line, and storage nodes 24 and 25. The circuit also includes two sense-amplifiers 26 and 27 in parallel.

Hereinbelow is explained an operation of the circuit illustrated in FIG. 1, with reference to FIG. 2 illustrating input timing waveforms.

With reference to FIG. 2, when bit line equalizing control signals NEQ and PEQ varies in such a fashion as illustrated in FIG. 2 at time t0, all transistors in a bit line equalizing circuit are turned off, and pre-charging of the bit line is completed. As a result, voltages across the transistors become Vcc/2.

Then, supposing that a memory cell 20 to which bit lines BLL1 and /BLL1 are electrically connected is selected, CUT2 turns off a transistor electrically connected to CUT2 of a separation circuit of the bit line sense-amplifier, and rises up a word line WLL1 at time t1. Herein, a symbol "/" means a complementary signal. For instance, "/BLL1" indicates a complementary signal of the signal BLL1.

As a result, data stored in the storage capacitor 21 is charge-transferred to the bit lines BLL1, BLR1, SBL1, SBL2 and /BLL1, /BLR1, /SBL1, and /SBL2.

Then, when signals CUT1 and REQ are fallen down at time t2, a bit line located at the same side of the memory cell 20 is separated from the sense-amplifier 26, and SBL1 and SBL2 are separated from /SBL1 and /SBL2. Thus, the sense-amplifiers 26 and 27 individually stores the same data transmitted from the memory cell 20.

After UP and DOWN signals have been altered in such a manner as illustrated in FIG. 2 at time t3, an operation of sense amplification caused by /SAS begins at time t4, and CUT1 and CUT2 are risen up at time t5 to thereby electrically connect the sense amplifier to a bit line located at the same side of the memory cell 20. Thus, there is carried out pull-up by /SAS.

Finally, CSEL is fallen down at time t6 to thereby transfer amplified data of the memory cell 20 into a data line. Thus, a reading operation is completed.

Since the above-mentioned memory cell 2 in the conventional circuit stores two-bit data in a single storage capacitor, there are four statuses of voltages across the storage nodes 24 and 25 when the memory cell stores data, as shown in Table 1. The term "Data" in Table 1 indicates data to be output to data lines D1 and D2. "H" corresponds to Vcc, and "L" corresponds to GND voltage.

TABLE 1

| Data | D1 = H<br>D2 = H | D1 = H<br>D2 = L | D1 = L<br>D2 = H | D1 = L<br>D2 = L |
|---|---|---|---|---|
| Node 14 | Vcc | 2 Vcc/3 | Vcc/3 | GND |
| Node 15 | GND | Vcc/3 | 2 Vcc/3 | Vcc |

FIG. 3 illustrates a status found when data D1=H and D2=H are to be read out, and FIG. 4 illustrates a status found when data D1=H and D2=L are to be read out.

As illustrated in FIG. 3, when data D1=H and D2=H are to be read out, there is generated a voltage difference ΔV between complementary bit lines at time t1 at which a word line rises up. At time t3, voltages of SBL1 and /SBL2 are risen by ΔV/3, whereas voltages of /SBL1 and SBL2 are decreased by ΔV/3, due to UP and DOWN signals.

However, without voltages of SBL1 and /SBL1 and voltages of SBL2 and /SBL2 being not reversed, Vcc level voltages are output through the data lines D1 and D2 after operation of sense-amplification has been conducted at time T4.

When data D1=H and D2=L are to be read out, as illustrated in FIG. 4, there is generated only a voltage difference ΔV/3 in each of complementary bit line pairs at time t1 at which word lines rise up. Thus, voltages of SBL1 and /SBL2 are increased by ΔV/3 by virtue of signals UP and DOWN at time t3. When voltages of /SBL1 and SBL2 are decreased by ΔV/3, voltages of SBL2 and /SBL2 are reversed. Accordingly, after operation of sense-amplification has been conducted at time t4, the voltage Vcc is output to the data line D1, and GND level is output to the data line D2.

However, since the above-mentioned conventional semiconductor memory device has a memory cell structure comprising two transistors and one capacitor, it is unavoidable that a memory cell has a complex structure and a method of fabricating the same is complicated in comparison with a general dynamic random access memory (RAM) having a memory cell structure comprising one transistor and one capacitor.

In addition, it is necessary in the above-mentioned conventional semiconductor memory device to draw wirings from opposite electrodes of a capacitor to complementary bit lines through two transistors. Hence, if higher integration would be attempted, it would be difficult to layout a memory device with symmetry being maintained in a structure, which would cause a problem of degradation in margin such as reading margin.

SUMMARY OF THE INVENTION

In view of the foregoing problems of the conventional semiconductor memory device, it is an object of the present invention to provide a dynamic type semiconductor memory device having a memory cell structure comprising one transistor and one capacitor, and being capable of storing two-bit data in a single memory cell. It is also an object of the present invention to provide a method of reading data out of such a dynamic type semiconductor memory device.

In one aspect, there is provided a dynamic type semiconductor memory device including (a) a first hierarchized complementary bit line, (b) a second hierarchized complementary bit line, (c) a first sense-amplifier electrically connected to the first bit line, (d) at least one second sense-amplifier electrically connected to both the first bit line and the second bit line, (e) a capacitor located between the first and second bit lines for each of second sense-amplifiers, and (f) a transfer gate arranged in series with the capacity between the first and second bit lines. If a plurality of second sense-amplifiers are provided to the dynamic type semiconductor memory device, the second sense-amplifiers are all electrically connected to the first bit line, and the second bit line is electrically connected to each of the second sense-amplifiers.

It is preferable that the capacitor is electrically connected at one end thereof to the second bit line, and further electrically connected at the other end thereof to one of signal terminals of the transfer gate electrically connected at the other signal terminal thereof to the first bit line.

It is preferable that when each of the second and first sense-amplifiers is successively activated twice, a first voltage amplified in the first bit line at the first time is transferred to the second bit line through the capacitor and the transfer gate, and then, a differential voltage read out of a selected memory cell onto the second bit line is amplified up to a differential voltage different from the first voltage to thereby activate the first sense-amplifier at the second time.

The dynamic type semiconductor memory device may further include a second transfer gate located between the second bit line for dividing the second bit line into first and second sections, in which case, different voltages are written into first and second sections of the second bit line, and the second transfer gate is activated to thereby generate four different voltages each of which is written into a memory cell.

There is further provided a dynamic type semiconductor memory device including (a) a hierarchical bit line including complementary principal bit line pair and subsidiary bit line pair, (b) a capacitor located between the principal bit line pair and the subsidiary bit line pair electrically connected to a subsidiary sense-amplifier, and (c) a transfer gate electrically connected in series to the capacitor between the principal bit line pair and the subsidiary bit line pair, wherein a differential voltage read out to the subsidiary bit line pair from a selected memory cell is transferred to the principal bit line pair, and is amplified by a master sense-amplifier electrically connected to the principal bit line pair, and data on the principal bit line pair is fed-back to the principal bit line pair through the capacitor, and read out again to the principal bit line pair from the subsidiary bit line pair, to thereby read out two-bit data.

The above-mentioned dynamic type semiconductor memory device may further include a second transfer gate dividing the subsidiary bit line pair into first and second sections, in which case, a certain combination of voltages is written into the first and second sections of the subsidiary bit line pair, and then, the second transfer gate is activated to thereby write four different voltages into the memory cell.

The above-mentioned dynamic type semiconductor memory device may further include a third transfer gate located between a plurality of the subsidiary bit line pairs and the subsidiary sense-amplifier, in which case, each of the subsidiary bit line pairs and the subsidiary sense-amplifier are in communication with each other through the third transfer gate in time-sharing to thereby successively read out data.

It is preferable that if one-bit data out of two-bit data read out by the subsidiary sense-amplifier is defective, the one-bit data is replaced with a subsidiary sense-amplifier prepared for compensating for defectiveness.

For instance, replacement of the one-bit data may be conducted by breaking a fuse of a circuit prepared for replacement. It is preferable that the subsidiary sense-amplifier prepared for compensating for defectiveness is a redundancy subsidiary sense-amplifier.

It is preferable that N pairs of a capacitor and a transfer gate are connected in parallel between the principal bit line pair and the subsidiary bit line pair, the capacitor being electrically connected in series to the transfer gate in each of the N pairs, wherein N is an integer equal to or greater than 2.

In another aspect, there is provided a method of reading data out of a dynamic type semiconductor memory device including a first sense amplifier having a principal bit line and a subsidiary bit line, and a capacitor located between the principal bit line and the subsidiary bit line, the method including the steps of (a) transferring a differential voltage read out of a selected memory onto the subsidiary bit line, to the principal bit line, (b) amplifying the differential voltage to thereby read out upper bit, (c) feeding data running on the principal bit line back to the subsidiary bit line through the capacitor, and (d) reading data from the subsidiary bit line to the principal bit line to thereby read out lower bit.

The method may further include the steps of (e) dividing the subsidiary bit line into first and second sections by means of a transfer gate, (f) writing different voltages into the first and second sections of the subsidiary bit line, and (g) activating the transfer gate to thereby generate four different voltages by distribution of electric charges, each of the different voltages being written into a memory cell.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

FIGS. 5 to 8 illustrates a dynamic type semiconductor memory device in accordance with the first embodiment.

Figure 1:
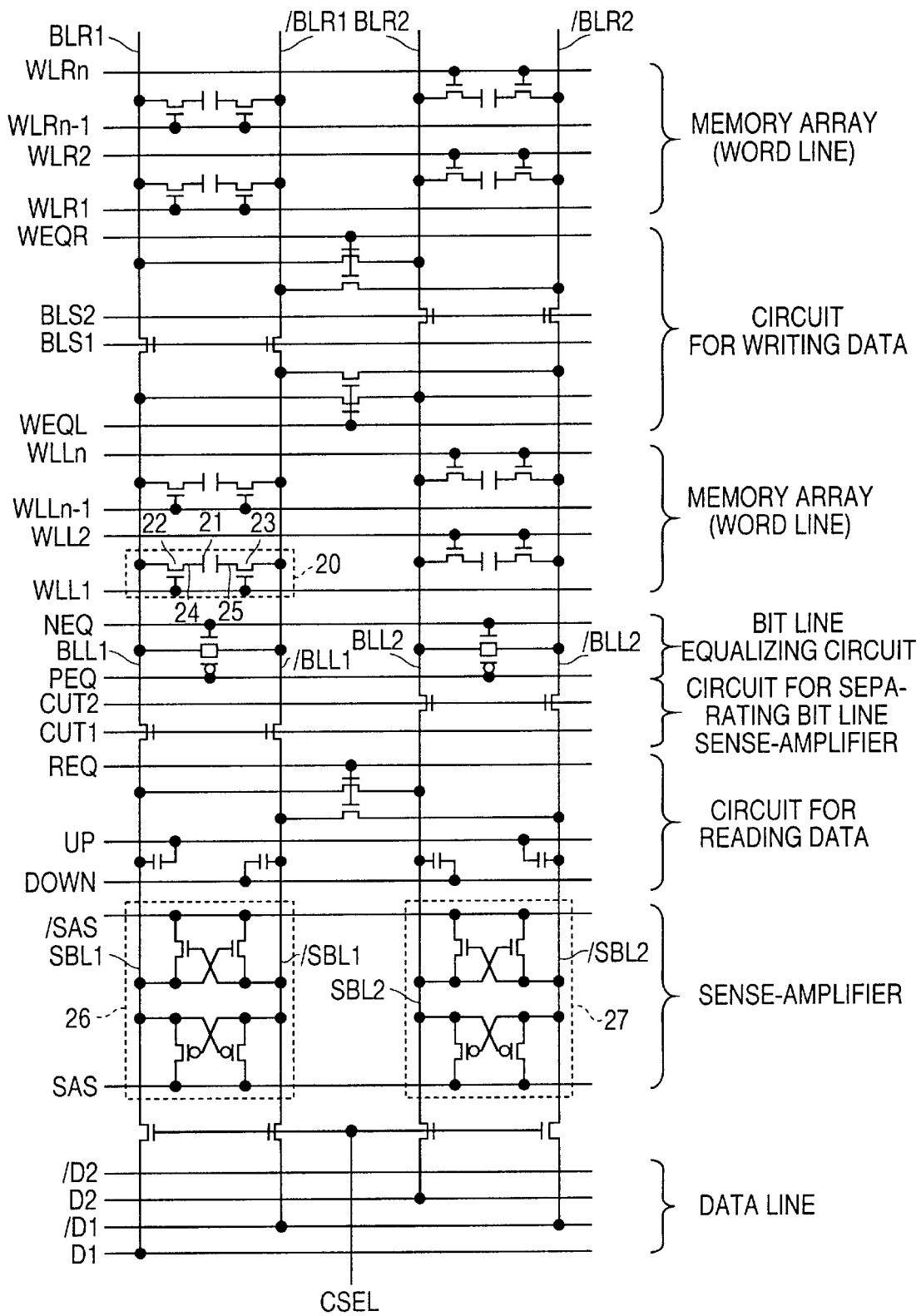
FIG. 1 is a circuit diagram of a conventional semiconductor memory device.
Figure 2:
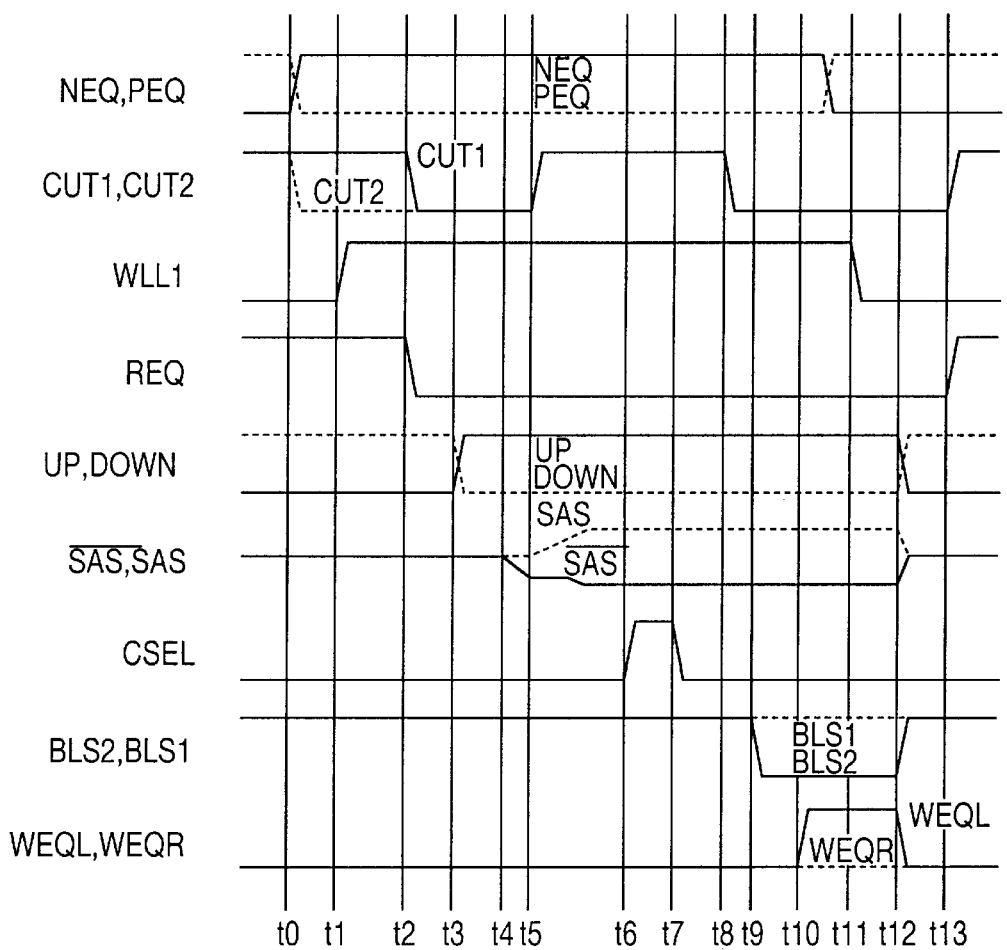
FIG. 2 illustrates waveforms of input timing signals in the circuit illustrated in FIG. 1.
Figure 3:
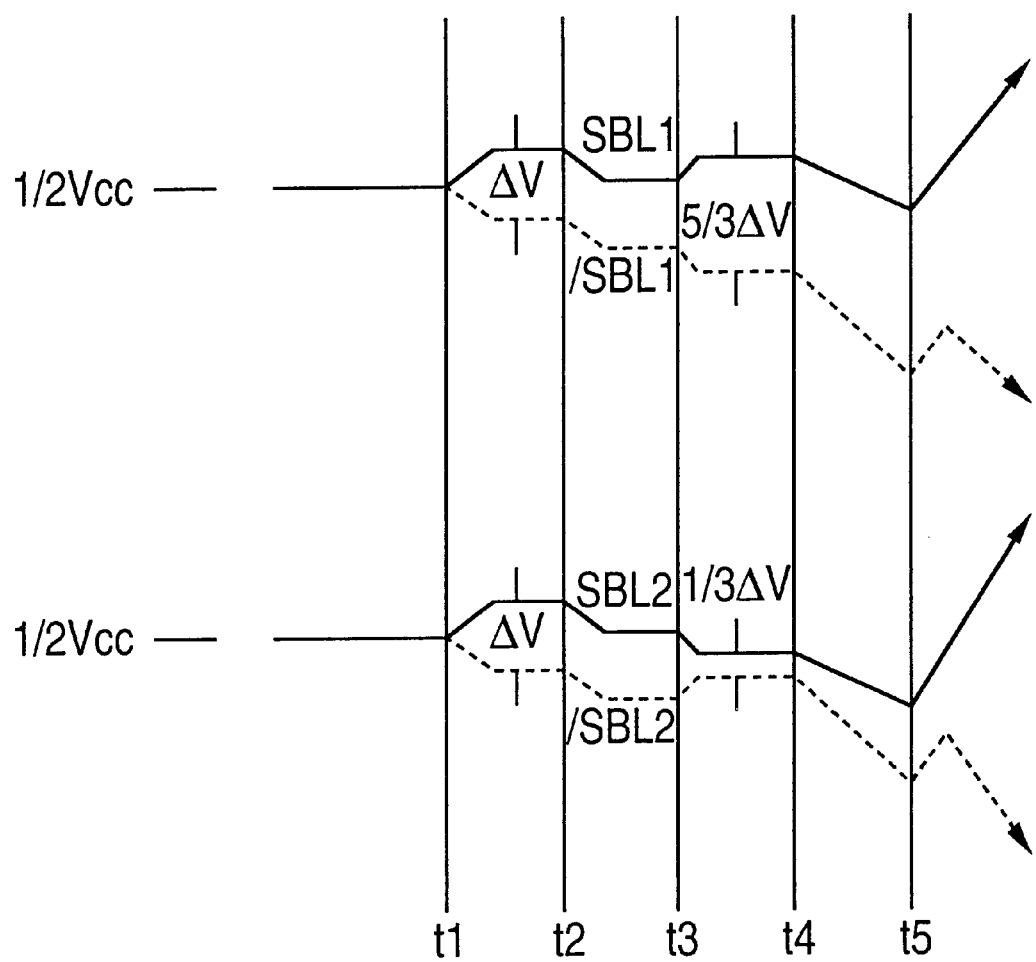
FIG. 3 illustrates waveforms of voltages at bit lines, generated when a bit line is to be read out in the circuit illustrated in FIG. 1.
Figure 4:
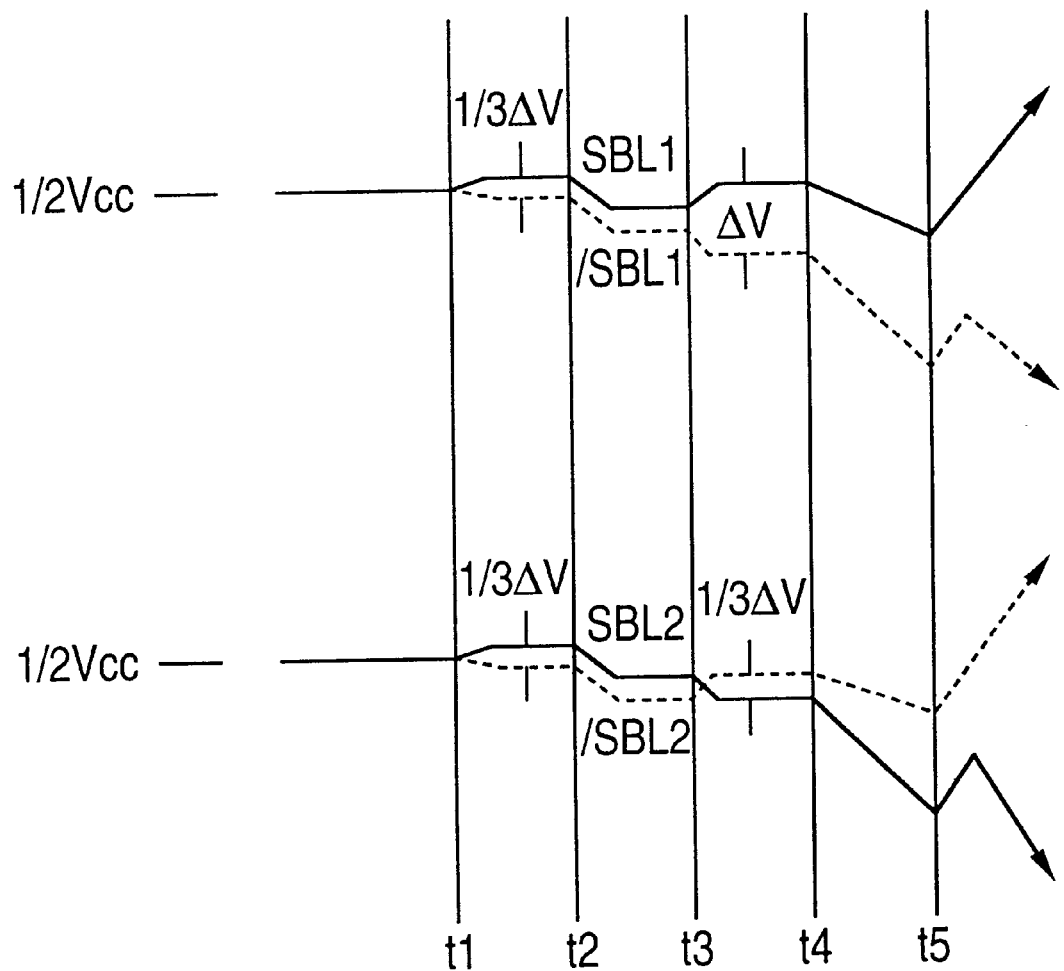
FIG. 4 illustrates waveforms of voltages at bit lines, generated when a bit line is to be read out in the circuit illustrated in FIG. 1.
Figure 5:
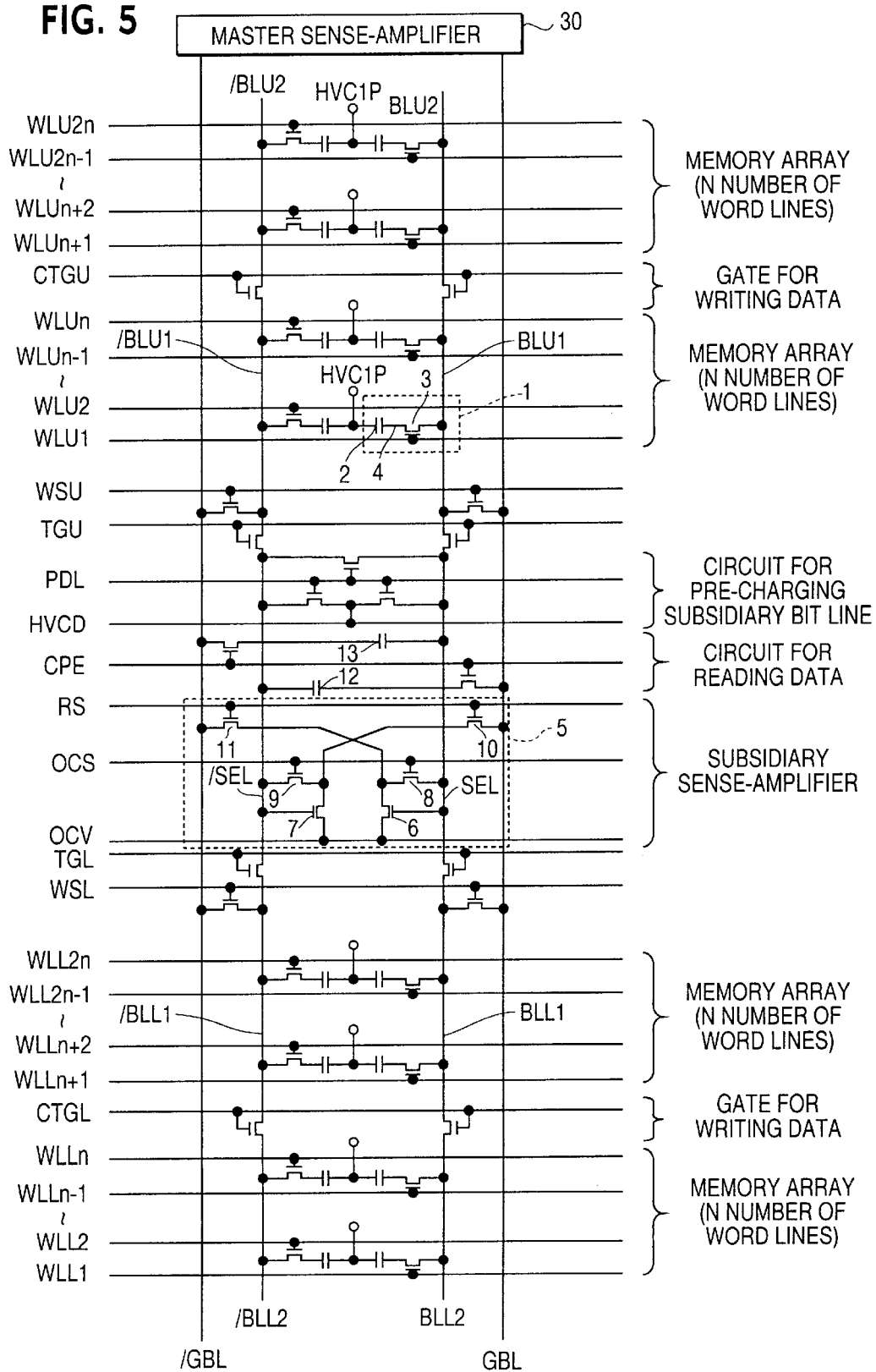
FIG. 5 is a circuit diagram of a semiconductor memory device in accordance with the first embodiment of the present invention.

With reference to FIG. 5, the illustrated dynamic type semiconductor memory device includes a plurality of memory cells 1, a master sense-amplifier 30, and a subsidiary sense-amplifier 5. The memory cell 1 includes storage capacitors 2, transfer gates 3 each connected in series to the storage capacitors 2, and storage nodes 4. The subsidiary sense-amplifier 5 includes sense-amplifying transistors 6 and 7, transistors 8 and 9 for compensating for a dispersion in a threshold voltage, and reading gates 10 and 11.

A bit line is hierarchized, namely, comprised of a complementary principal bit line and a subsidiary bit line. A pair of principal bit lines is electrically connected to the single master sense-amplifier 30 and a plurality of the subsidiary sense-amplifiers 5.

As explained hereinbelow in detail, the illustrated dynamic type semiconductor memory device further includes capacitors 12 and 13 between the subsidiary bit lines SBL and /GBL and GBL, and the principal bit lines SBL and /GBL of the subsidiary sense-amplifier 5. The capacitors 12 and 13 are employed for feed-back operation.

A differential voltage read out of a selected memory onto the subsidiary bit line is transferred to the principal bit line, and is amplified by the master sense-amplifier 30, to thereby read out upper-bit data. At the same time, data on the principal bit line is fed back to the subsidiary bit line through the capacitors 12 and 13. Thereafter, data is read out from the subsidiary bit line to the principal bit line to thereby read out lower-bit data.

The transfer gates 3 located between the subsidiary bit line divides the subsidiary bit line into first and second sections. Different voltages are written into the first and second sections of the subsidiary second bit line, and then, the transfer gates 3 are activated to thereby generate four different voltages by distribution of electric charges. The thus generated different voltages are written into a memory cell.

Hereinbelow is explained an operation of the dynamic type semiconductor memory device in accordance with the first embodiment.

First, there is explained reading operation of the memory cell 1 selected by a word line WLU1 and a subsidiary bit line BLU1.

Figure 6:
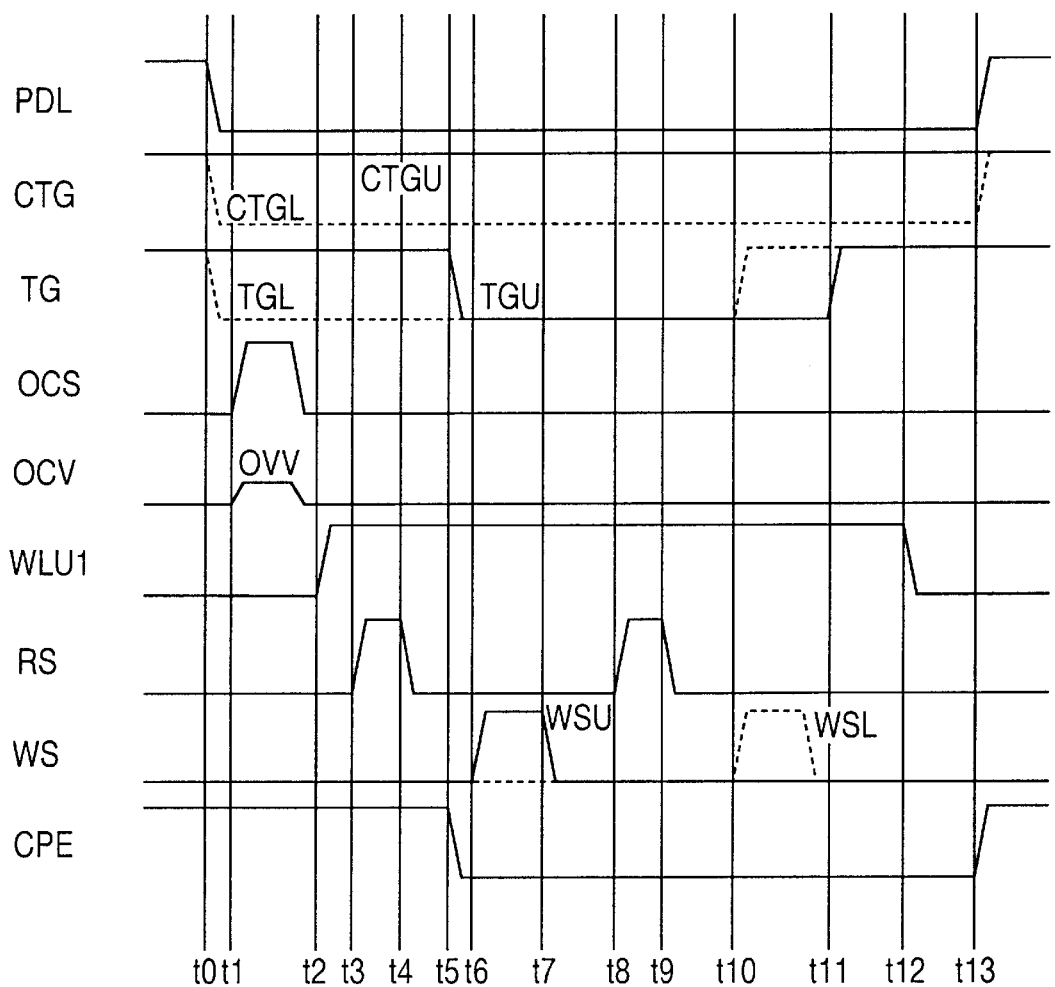
FIG. 6 illustrates waveforms of input timing signals in the circuit illustrated in FIG. 5.

With reference to FIG. 6, when a signal PDL for controlling pre-charge of a subsidiary bit line is varied from H level to L level in such a manner as illustrated in FIG. 6 at time t0, all transistors in the subsidiary bit line pre-charging circuit are turned off. Thus, pre-charging of the subsidiary bit line is completed. The subsidiary bit lines BLU1, /BLU1, BLU2, /BLU2, SBL, /SBL, BLL1, /BLL1, BLL2, /BLL2 remain to have a voltage of Vcc/2.

At time t0, a control signal CTGL for controlling a transfer gate for writing, and a control signal TGL for controlling a transfer gate inserted into a subsidiary bit line are varied from H level to L level in such a manner as illustrated in FIG. 6. As a result, transistors receiving the signals CTGL and TGL as gate inputs are turned off, and SBL, /SBL, BLL1, /BLL1 are separated from BLL1, /BLL1, BLL2, /BLL2, respectively.

When signals OCS and OCV for canceling off-set of the subsidiary sense-amplifier 5 are varied in such a manner as illustrated in FIG. 6 at time t1, the transistors 8 and 9 which receive the signals OCS and OCV as gate inputs, respectively, are turned on, and the subsidiary bit line pair SBL and /SBL is diode-connected to the signal OCV through the sense-amplifying transistors 6 and 7. Supposing that the signal OCV has a level of OVV, and that the transistors 6 and 7 have threshold voltages of VTH6 and VTH7, respectively, the subsidiary bit lines SBL and /SBL have voltages of (OVV+VTH6) and (OVV+VTH7), respectively.

By carrying out the above-mentioned operation, a dispersion in a threshold voltage of the sense-amplifying transistors 6 and 7, generated while they were being fabricated, is compensated for. It is possible to prevent degradation of reading margin caused by a dispersion in a threshold voltage, by reading data stored in the memory cell 1 onto the subsidiary bit line.

However, it should be noted that, supposing that the sense-amplifying transistors 6 and 7 are designed to have threshold voltages of VTH0, it would be necessary to set OVV level to be equal to (Vcc/2−VTH−α) wherein α indicates a certain voltage.

Hereinbelow, an explanation is made for simplicity on the condition that VTH6 is equal to VTH7 (VTH6=VTH7), namely, there is no dispersion in a threshold voltage.

After the above-mentioned step for compensating for a dispersion in a threshold voltage has been completed, a voltage of the word line WLU1 is varied from L level to H level at time t2. As a result, the transfer gate 3 is turned on, and data stored in the storage capacity 2 is charge-transferred to the subsidiary bit lines BLU2, BLU1 and SBL.

The memory cell in the semiconductor memory device in accordance with the first embodiment stores two-bit data in a single storage capacity. Hence, the storage node 4 could have four different voltages when the memory cell stores data therein: a source voltage Vcc; 2Vcc/3; Vcc/3; and a ground voltage GND. Those four different voltages correspond to "11", "10", "01", and "00" in a two-bit binary numeral, respectively.

Figure 7:
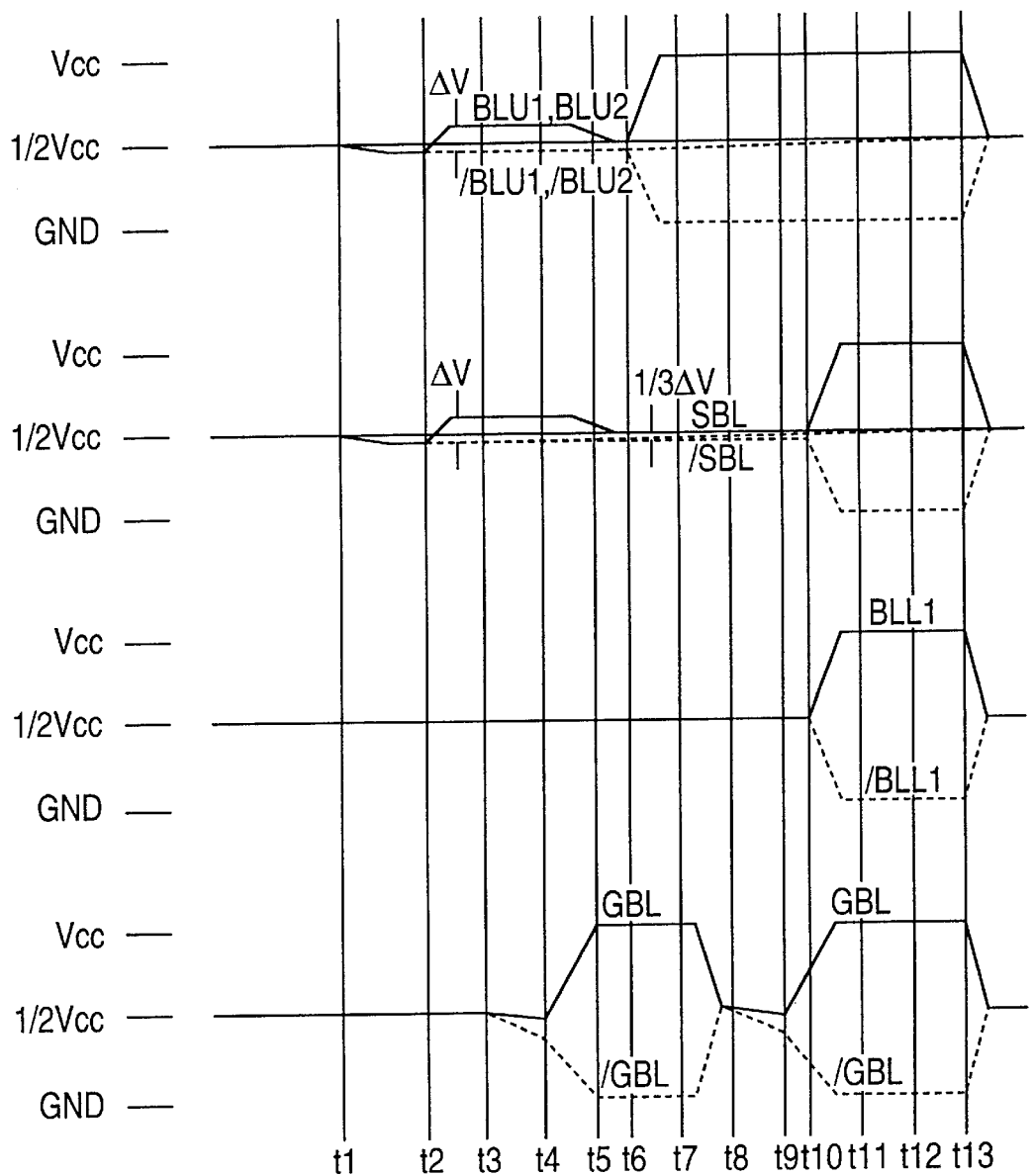
FIG. 7 illustrates waveforms of voltages at bit lines, generated when a bit line is to be read out in the circuit illustrated in FIG. 5.
Figure 8:
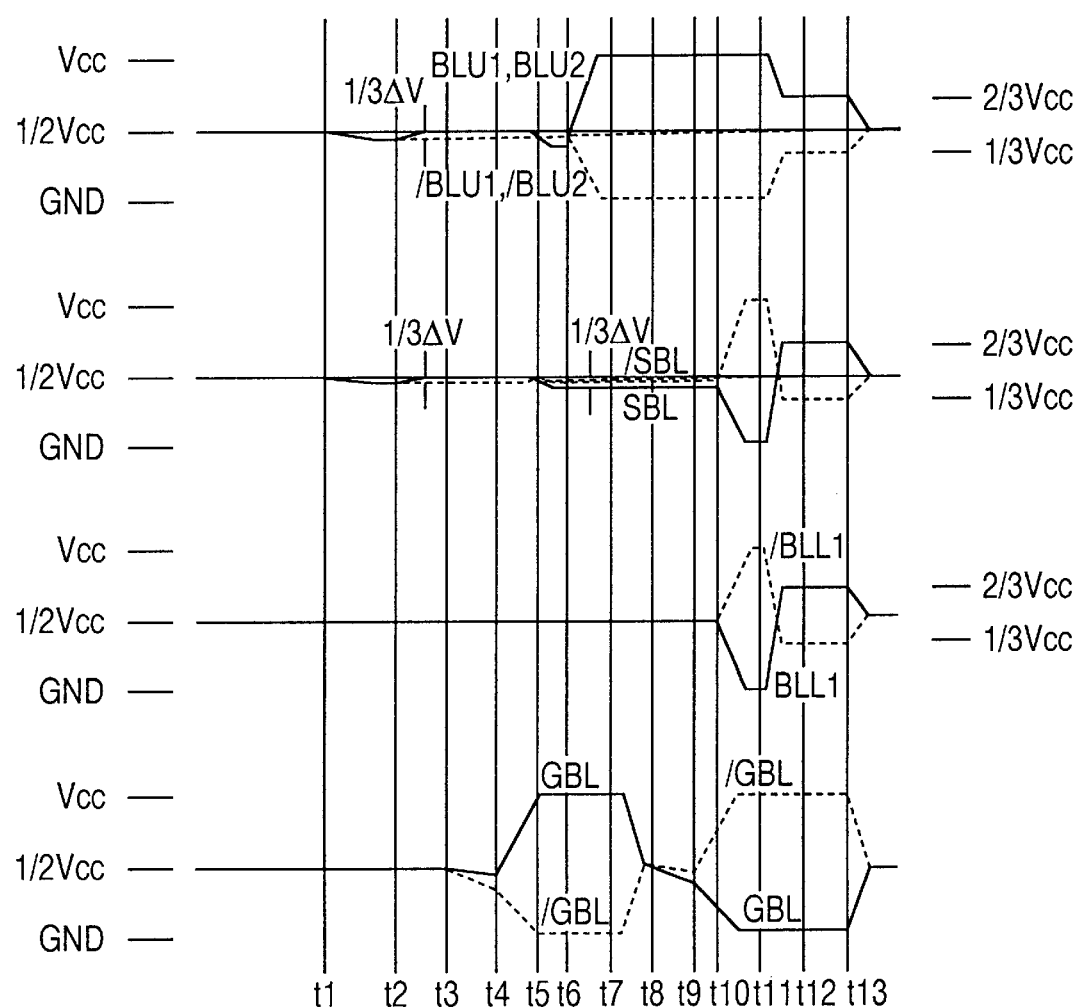
FIG. 8 illustrates waveforms of voltages at bit lines, generated when a bit line is to be read out in the circuit illustrated in FIG. 5.
Figure 9:
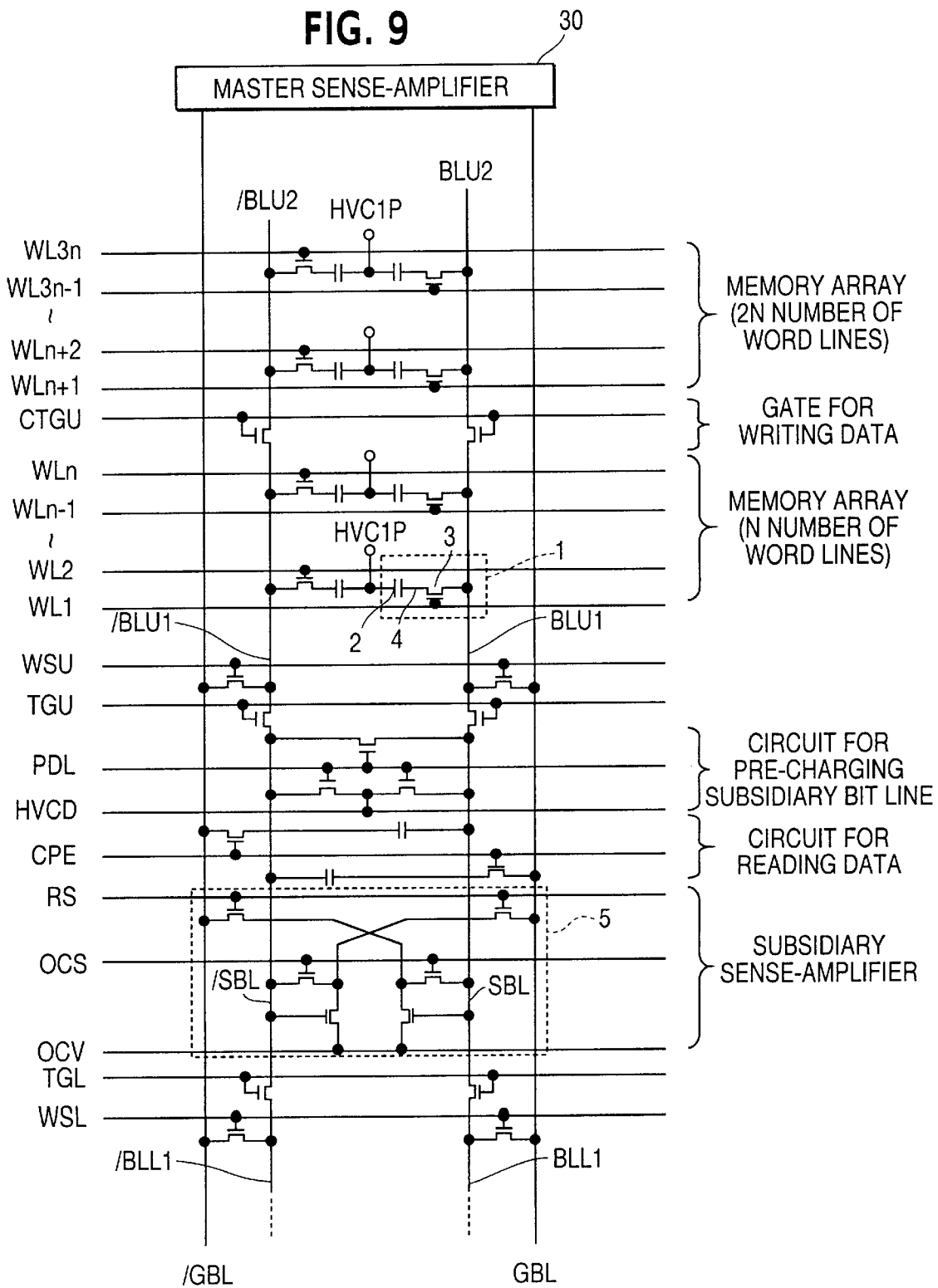
FIG. 9 is a circuit diagram of a semiconductor memory device in accordance with the second embodiment of the present invention.

Waveforms of voltages in the principal and subsidiary bit lines, generated when data "11" corresponding to the voltage Vcc, are illustrated in FIG. 7, and waveforms of voltages in the principal and subsidiary bit lines, generated when data "10" corresponding to the voltage 2Vcc/3, are illustrated in FIG. 8.

After a voltage of the word line WLU1 has risen up at time t2, there is generated a voltage difference $\Delta V$ between the complementary subsidiary bit line pair BLU1 and /BLU1, as illustrated in FIG. 7, when the memory cell 1 stores data "11", whereas there is generated a voltage difference $\Delta V/3$ between the complementary subsidiary bit line pair BLU1 and /BLU1, as illustrated in FIG. 8, when the memory cell 1 stores data "10".

A voltage of a read switch signal RS is varied from L level to H level at time t3, as illustrated in FIG. 6. As a result, the transistors 10 and 11 in the subsidiary sense-amplifier 5 are turned on, and a voltage at the principal bit line which has been pre-charged at Vcc/2 by a principal bit line pre-charging circuit (not illustrated) is lowered in accordance with gate voltages at the sense-amplifying transistors 6 and 7, that is, a level of the subsidiary bit line pair. Thus, the voltage difference which has been read onto the subsidiary bit line is transferred to the principal bit line GBL and /GBL.

At time t4, the voltage of the read switch signal RS is fallen down to L level, and a voltage difference between the voltages of the principal bit lines GBL and /GBL is amplified to Vcc or GND level by the master sense-amplifier 30, as illustrated in FIGS. 7 and 8. When the memory cell 1 stores data "11" or "10", the voltage of the principal bit line GBL is amplified to Vcc level, and the voltage of the principal bit line /GBL is amplified to GND level, as illustrated in FIGS. 7 and 8. This indicates an operation of reading upper-bit data, specifically, "H" data is read out in either cases. On the other hand, when the memory cell 1 stores data "01" or "00", "L" data is read out by the above-mentioned operation of reading upper-bit data.

Since a signal CPE, which controls communication of the transfer gates electrically connected in series to the capacitors 12 and 13, respectively, between the principal and subsidiary bit lines, while the principal bit line is being amplified, that is, from time t4 to t5, is kept at H level, a voltage at the subsidiary bit line is affected by fluctuation in a voltage at the principal bit line by the capacitors 12 and 13 in a data-reading circuit, and hence, is also varied.

When the memory cell stores data "11" or "10" therein, the voltages at the subsidiary bit lines SBL, BLU1 and BLU2 are increased by $\Delta V/3$, and the subsidiary bit lines /SBL, /BLU1 and /BLU2 are decreased by $\Delta V/3$. Hence, the voltages of the subsidiary bit lines SBL and /SBL are reversed, as illustrated in FIG. 8.

At time t5, the voltages of the signals TGU and CPE are lowered down to L level, and resultingly, the bit lines and the sense-amplifiers are separated away from each other in the memory cell. Thereafter, a voltage of the subsidiary bit line is not affected by fluctuation in a voltage of the principal bit line.

At time t6, a write switch signal WSU rises up, and as a result, an amplified voltage of the principal bit line is written into each of the subsidiary bit lines BLU1, BLU2, /BLU1, and /BLU2.

At time t7, the write switch signal WSU falls down, and thus, the principal bit line is pre-charged at a voltage of Vcc/2.

At time t8, the read switch signal RS is activated again, and as a result, a voltage difference between the subsidiary bit lines SBL and /SBL is transferred to the principal bit lines GBL and /GBL, and amplified.

If the memory cell stores data "11" therein, "H" data is read out, as illustrated in FIG. 7. On the other hand, if the memory cell stores data "10" therein, "L" data is read out, as illustrated in FIG. 8, because the voltages of the subsidiary bit lines SBL and /SBL are reversed in comparison with a case wherein upper-bit data is to be read out. The above-mentioned operation is an operation for reading lower-bit data.

FIG. 7 illustrates an operation for reading data "11", and FIG. 8 illustrates an operation for reading data "10".

When the memory cell stores data "01" and "00" therein, they are read out in the same way as mentioned above.

At time t10, the voltages of WSL and TGL are risen up, as illustrated in FIG. 6. As a result, data stored in the principal bit line is written into the subsidiary bit lines SBL, BLL1 and /SBL, /BBL1, respectively.

After the write switch signal WSL has been fallen down, if the memory cell stores data "10" therein, as illustrated in FIG. 8, for instance, the subsidiary bit lines BLU1 and BLU2 is kept at Vcc level, and the subsidiary bit lines SBL and BLL1 are kept at GND level.

Supposing the subsidiary bit line BLU1 has a parasitic capacity of CB, which is equivalent to a parasitic capacity of N number of word lines, both the subsidiary bit lines BLU2 and BLL1 have a parasitic capacity of CB. Now supposing that a parasitic capacity of the subsidiary bit line SBL can be disregarded because it is too small in comparison with CB, when the signal TGU is risen up at time t11, the subsidiary bit lines BLU2, BLU1, SBL and BLL1 are all connected. By virtue of capacity coupling, voltage levels at both the subsidiary bit line BLU1 and the storage node 4 are represented with the following equation (1).

$$(2CB \times Vcc + CB \times 0[V])/3CB = 2Vcc/3 \qquad (1)$$

Then, at time t12, the word line WLU1 is fallen down, resulting in that 2Vcc/3 or data "10" is rewritten into the memory cell. Table 2 shows four different voltages at each of the subsidiary bit lines at rewriting.

TABLE 2

|  | Immediately before t11 | | Immediately after t11 |
| --- | --- | --- | --- |
|  | BLU1, BLU2 | SBL, BLL1 | BLU1, BLU2, SBL, BLL1 |
| Data "11" | Vcc | Vcc | Vcc |
| Data "10" | Vcc | GND | 2 Vcc/3 |
| Data "01" | GND | Vcc | Vcc/3 |
| Data "00" | GND | GND | GND |

Now supposing that when the word line WLU1 is risen up with data "11" or Vcc level being kept in the memory cell, a voltage difference read out to the subsidiary bit lines BLU1 and BLU2 is represented with $\Delta V$, a parasitic capacity of bit lines equivalent to the N number of word lines, that is, a parasitic capacity of the subsidiary bit lines BLU1 and BLU2 is represented with CB, a storage capacity of the memory cell is represented with CS, and a capacity of each of the capacitors 12 and 13 is represented with CC, and that a capacity of a bit line in the subsidiary sense-amplifier can be disregarded because it is too small relative to a capacity of a bit line in the memory cell, the voltage difference $\Delta V$ is represented with the following equation (2).

$$\Delta V = CC/(CS+2CB+CC) \times Vcc/2 \qquad (2)$$

Supposing that fluctuation in a voltage of a subsidiary bit line, caused by fluctuation in a voltage of a principal bit line through the capacitors 12 and 13 during time t4 to time t5, is represented with $\Delta Va$, the following equation (3) is established relating to the fluctuation $\Delta Va$.

$$Vcc/2 \times CC = (CS+2CB+CC) \times \Delta Va \qquad (3)$$

Based on the above-mentioned equations (1) and (2), there is calculated CC which satisfies the equation $\Delta Va = \Delta V/3$. The following equation (4) is obtained from the equations (1) and (2).

$$CC = CS/3 \qquad (4)$$

In view of the equation (4), it is understood that the capacity CC of each of the capacitors 12 and 13 is arranged equal to one-third of the storage capacity CS. For instance, a capacity equal to one-third of the storage capacity CS can be accomplished by connecting three storage capacities in series.

Hereinbelow is explained writing operation of the dynamic type semiconductor memory device in accordance with the first embodiment.

Waveforms of input timing signals transmitted to the subsidiary sense-amplifier in writing operation are the same as those illustrated in FIG. 6 except that during the write switch signals WSU and WSH are kept active, or during time t6 to time t7 and time t10 to time t11, a signal is written into a subsidiary bit line from the master sense-amplifier through a principal bit line in accordance with data to be written in writing operation, whereas a signal amplified by the master sense-amplifier is rewritten into a subsidiary bit line from a principal bit line in accordance wit read-out data in reading operation.

During time t6 to time t7, the write switch signal WSU is kept at "H" level, as illustrated in FIG. 6. If data to be written is "11"or "10", the principal bit line GBL is kept at "H" level, and the principal bit line /GBL is kept at "L" level. On the other hand, if data to be written is "01"or "00", the principal bit line GBL is kept at "L" level, and the principal bit line /GBL is kept at "H" level. In addition, "H" or "L" level is written into the subsidiary bit line BLL1.

Thereafter, at time t11, the signal TGU for controlling the transfer gate inserted between the subsidiary bit lines BLU1 and SBL or between the subsidiary bit lines /BLU1 and /SBL in the same manner as that of reading operation. Thus, the four different voltages shown in Table 2 can be written into the memory cell.

A dynamic type semiconductor memory device in accordance with the second embodiment is explained hereinbelow with reference to FIGS. 9 to 12.

The dynamic type semiconductor memory device in accordance with the second embodiment has the same structure as the semiconductor memory device in accordance with the first embodiment except a structure of a memory cell and waveforms of input timing signals.

Hereinbelow is explained an operation of reading data stored in the memory cell 1 selected by the word line WL1 and the subsidiary bit line BLU1.

Figure 10:
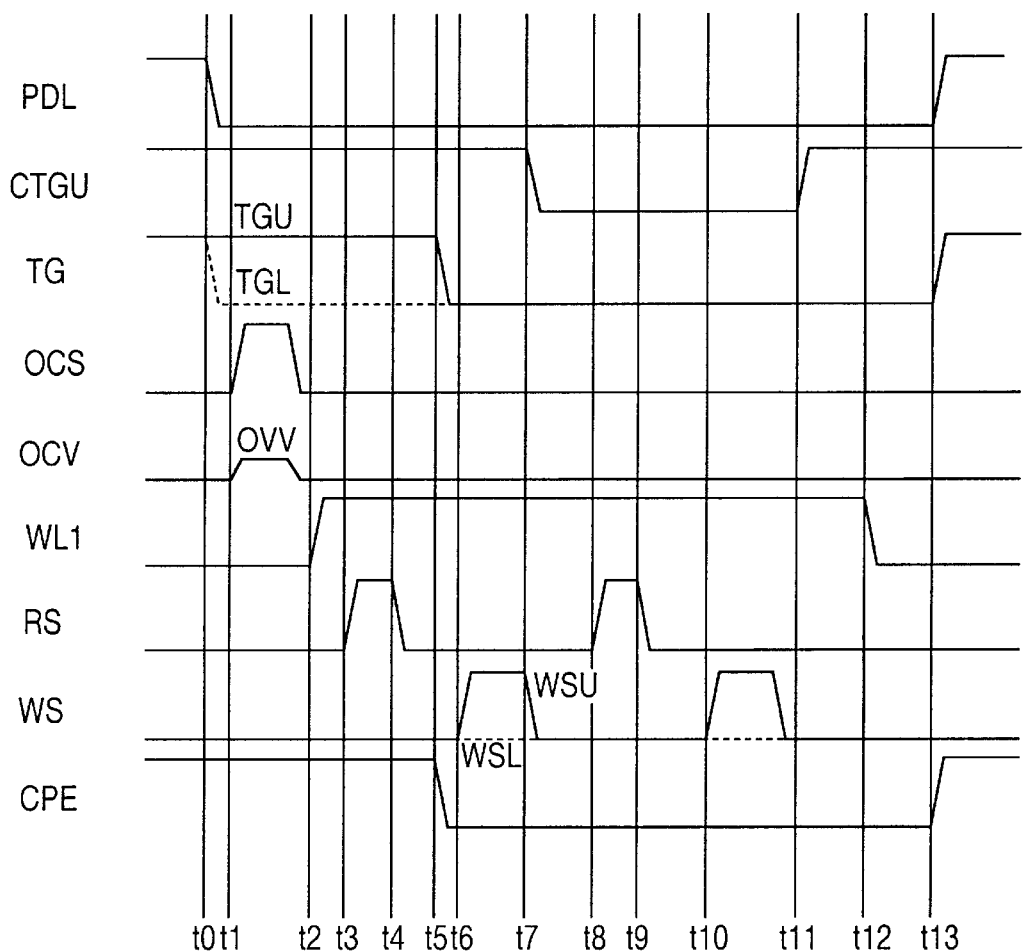
FIG. 10 illustrates waveforms of input timing signals in the circuit illustrated in FIG. 9.

Similarly to the first embodiment, at time t0, the signals PDL and TGL are varied in such a manner as illustrated in FIG. 10, resulting in that pre-charging of a subsidiary bit line is completed, and that the bit lines BLL1 and /BLL1 are separated away from the subsidiary sense-amplifier 5.

Then, at time t1, an operation for compensating for a dispersion in a threshold voltage of sense-amplifying transistors is carried out. At time t2, the word line WL1 rises up, resulting in that data stored in the storage capacity 2 is read out to the subsidiary bit lines BLU1, BLU2 and SBL.

At time t3, a read switch signal RS rises up, and resultingly, a differential voltage in the subsidiary bit line is transferred to a principal bit line. At time t4, the differential voltage transferred to the principal bit line is amplified by a master sense-amplifier 30.

Figure 11:
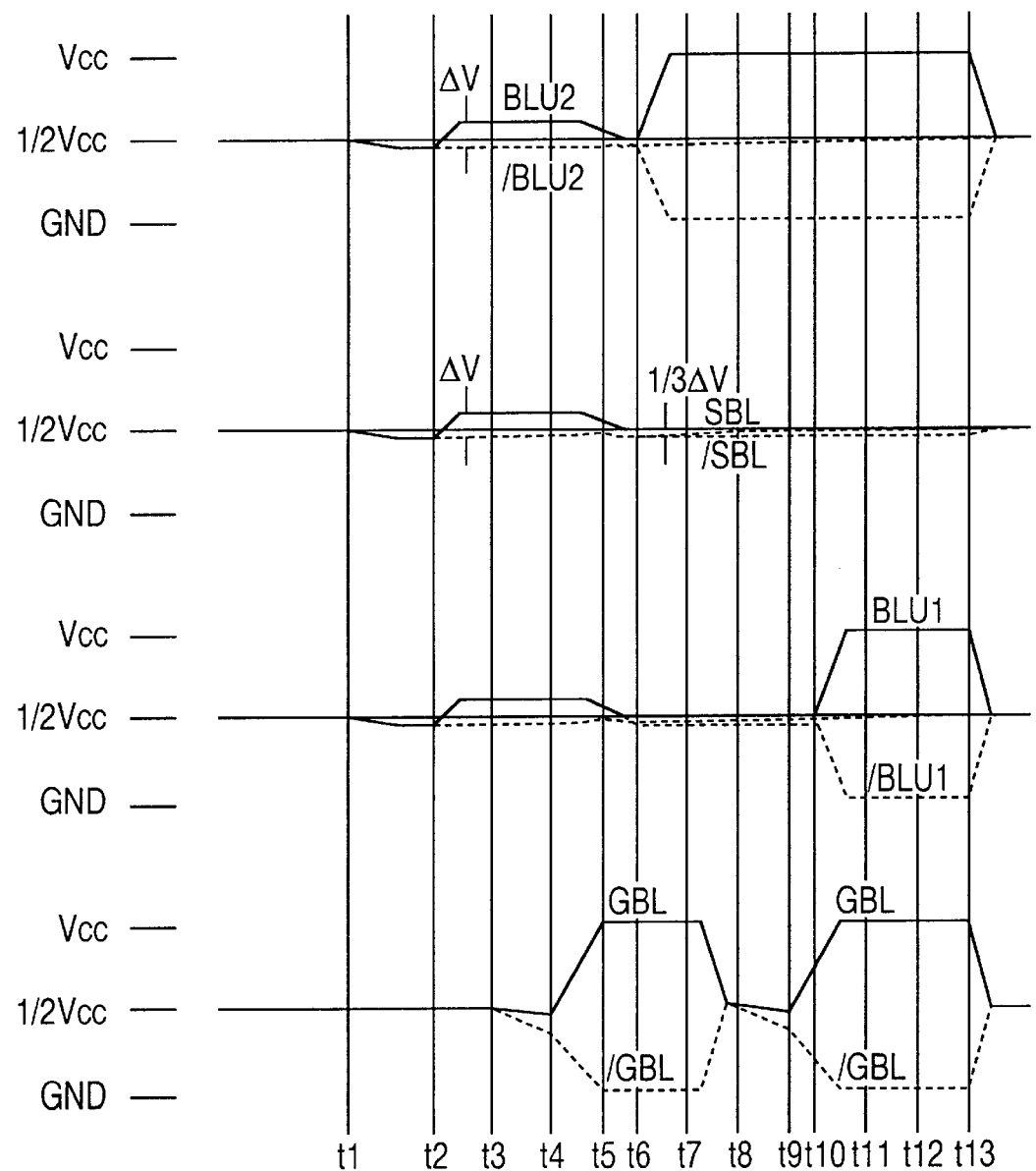
FIG. 11 illustrates waveforms of voltages at bit lines, generated when a bit line is to be read out in the circuit illustrated in FIG. 9.
Figure 12:
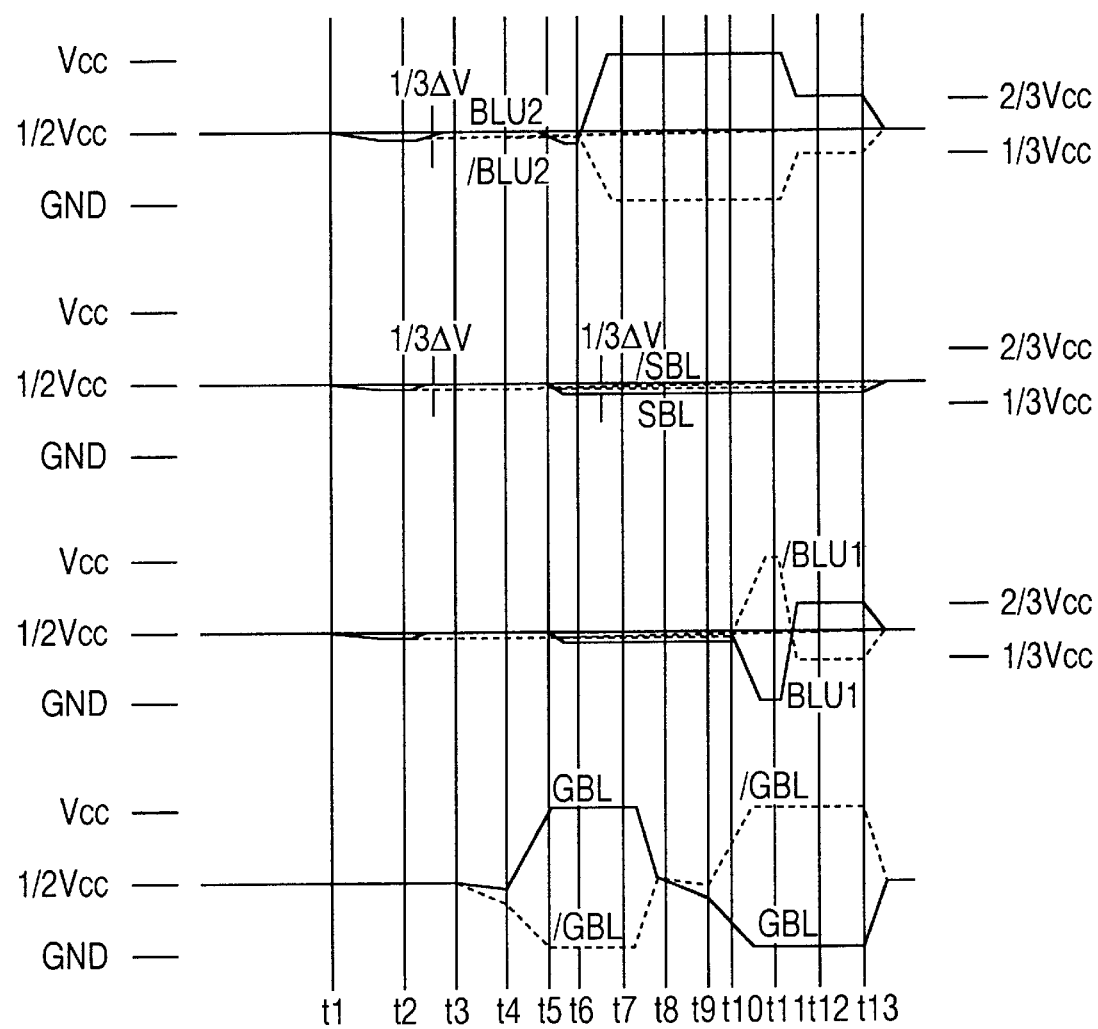
FIG. 12 illustrates waveforms of voltages at bit lines, generated when a bit line is to be read out in the circuit illustrated in FIG. 9.

As illustrated in FIGS. 11 and 12, fluctuation in a voltage of the principal bit line is transferred to the subsidiary bit line through the capacitors 12 and 13 contained in the subsidiary sense-amplifier 5, resulting in that a voltage of the subsidiary bit line is varied by $\Delta V/3$, similarly to the first embodiment.

Then, at time t5, the signals TGU and CPE are varied in such a manner as illustrated in FIG. 10. At time t6, the write switch signal WSU rises up, resulting in that an amplified level of the principal bit line is written into the subsidiary bit lines BLU1, /BLU1, BLU2, and /BLU2. The steps as mentioned so far are the same as those in the first embodiment.

At time t7, the write switch signal WSU is fallen down, and at the same time, the signal CTGU is also fallen down, resulting in that the subsidiary bit lines BLU1 and BLU2 are separated away from /BLU1 and /BLU2, respectively.

Then, the principal bit line is pre-charged at Vcc/2. At time t8, the read switch signal RS rises up again, resulting in that lower-bit data is transferred to the principal bit line. Upper and lower bit data is transferred to the principal bit line from the subsidiary bit line, and read out in accordance with the same principle as that of the first embodiment.

At time t9, the lower-bit data having been transferred to the principal bit line is amplified by the master sense-amplifier 30. At time t10, the write switch signal WSU rises up again, resulting in that a voltage level at the principal bit line is written into the subsidiary bit lines BLU1 and /BLU1. At this time, since the signal CTGU is kept at GND level, and hence, data to be written is kept in off-state, the subsidiary bit lines BLU2 and /BLU2 are kept at a level for rewriting upper-bit level.

Thereafter, the write switch signal WSU is fallen down. At time t11, the signal CTGU is risen up, and as a result, the subsidiary bit lines BLU1 and BLU2 are connected to /BLU1 and /BLU2, respectively. At this time, the subsidiary bit line BLU2 has a parasitic capacity equivalent to a parasitic capacity of the 2N number of word lines, namely, a bit line capacity of 2CB, whereas the subsidiary bit line BLU1 has a parasitic capacity equivalent to a parasitic capacity of the N number of word lines, namely, a bit line capacity of CB.

Hence, after the signal CTGU has been risen up, four voltage levels shown in Table 2, Vcc, 2Vcc/3, Vcc/3, and GND, are written into both the subsidiary bit line and the storage node 4 in accordance with four different voltages stored in the storage capacity of the memory cell, similarly to the first embodiment. Thereafter, at time t12, the word line WL1 is fallen down, and thus, the reading and rewriting operation is completed.

In writing operation, during the write switch signal WSU is being activated, or during time t6 to time t7 and time t10 to time t11, upper- and lower-bit data among data to be written are successively written into the subsidiary bit line from the master sense-amplifier 30 through the principal bit line.

Figure 13:
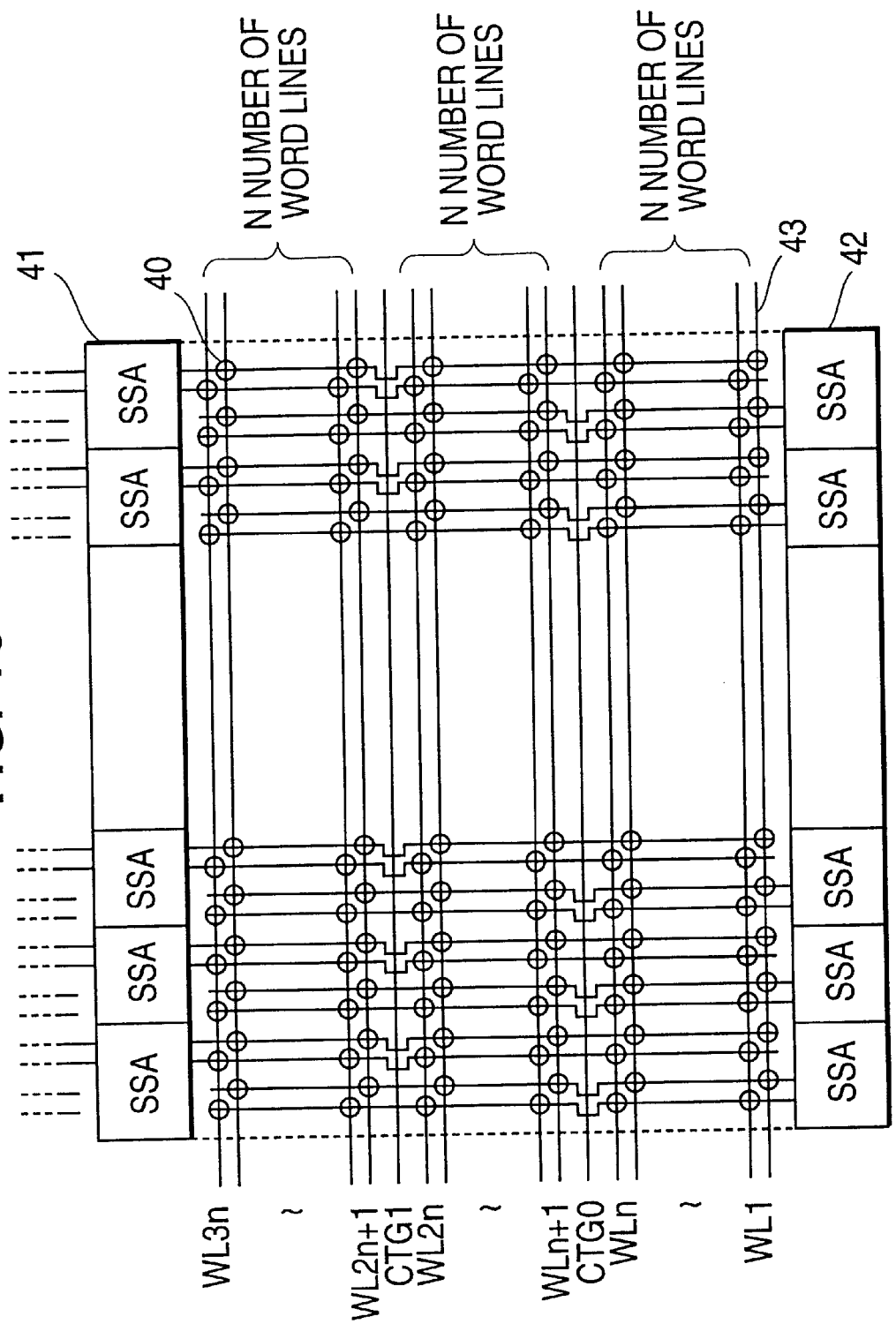
FIG. 13 is a plan view illustrating a layout of a semiconductor memory device in accordance with the second embodiment.

FIG. 13 illustrates an example of a memory array comprising the semiconductor memory device in accordance with the second embodiment. The illustrated memory array includes a plurality of memory cells 40 arranges in an array, and first and second rows 41 and 42 of subsidiary sense-amplifiers located above and below the memory cell array, respectively. The memory cells 40 are alternately connected to the first and second rows 41 and 42 of subsidiary sense-amplifiers in every vertical row.

Word lines 43 are grouped into three blocks each containing N number of word lines 43. CTGU of the upper row 41 of the sense-amplifiers and CTGU of the lower row 42 of the sense-amplifiers are positioned among the blocks in such a manner as illustrated in FIG. 13. This ensures that data can be normally read out of or written into all the memory cells 40.

In accordance with the above-mentioned first embodiment, it is necessary to have both a bit line capacity of one (for instance, BLU1 or BLU2) of subsidiary bit lines of the subsidiary sense-amplifier and a bit line capacity of the other (for instance, BLL1) in order to generate four different voltages in rewriting step. Hence, it is necessary to provide a dummy subsidiary bit line to be used as a parasitic capacity for rewriting, outside the subsidiary sense-amplifier located outermost in the memory array. However, in accordance with the second embodiment, only one of the subsidiary bit lines of the subsidiary sense-amplifier is employed, and it is not necessary to use a dummy subsidiary bit line.

A dynamic type semiconductor memory device in accordance with the third embodiment is explained hereinbelow with reference to FIGS. 14 to 16.

The semiconductor memory device in accordance with the third embodiment has the same structure as that of the semiconductor memory device in accordance with the second embodiment except how a subsidiary bit line and a subsidiary sense-amplifier are connected to each other.

Figure 14:
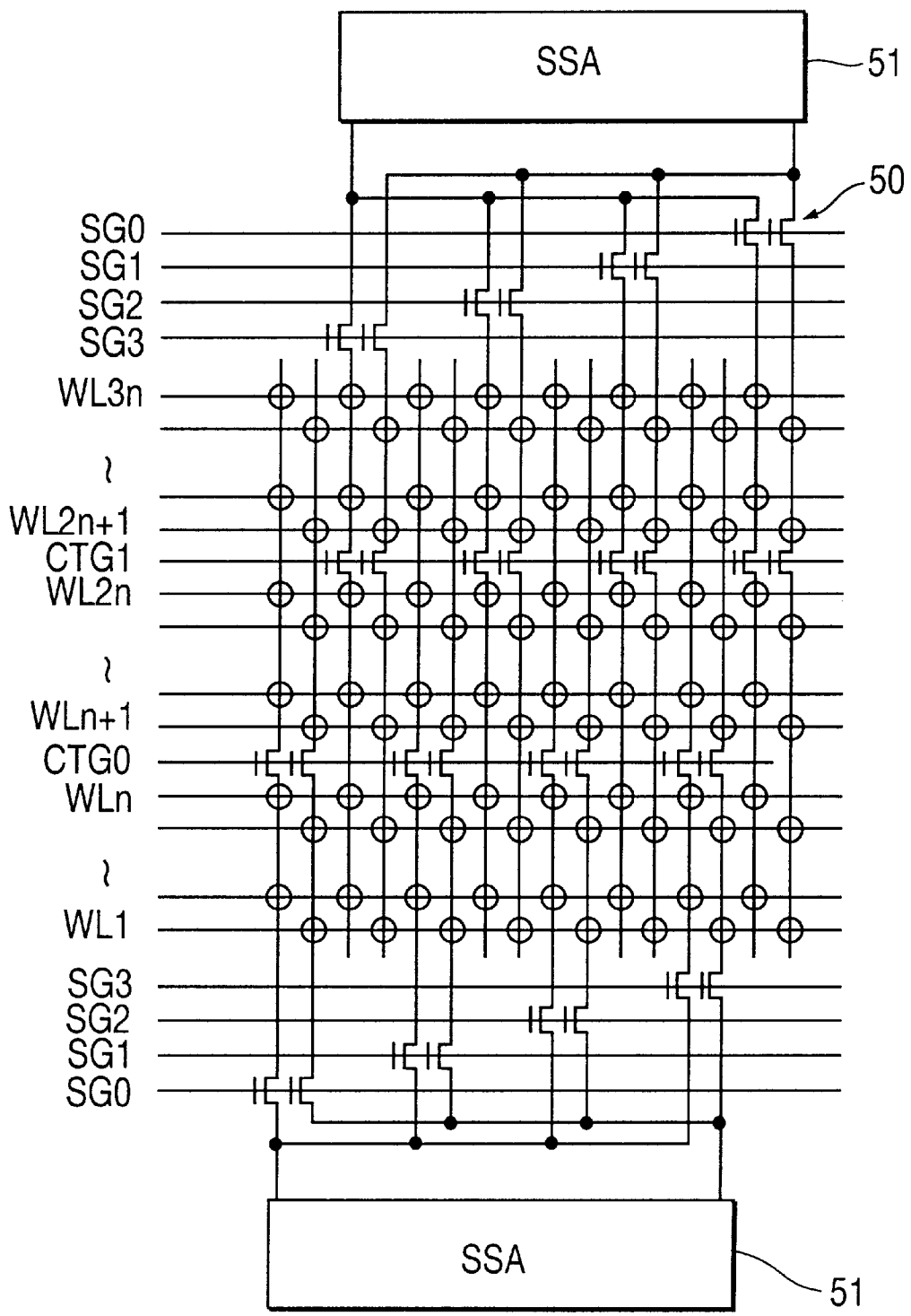
FIG. 14 is a plan view illustrating a layout of a semiconductor memory device in accordance with the third embodiment of the present invention.

As illustrated in FIG. 14, a plurality of transfer gates 50 receiving signals SG3 as a gate input from transfer gate control signals SG0 are connected between a subsidiary bit line and a subsidiary sense-amplifier 51 in such a manner as illustrated in FIG. 14, namely, such that four subsidiary bit line pairs are shared by a single subsidiary sense-amplifier 51. The structure as illustrated in FIG. 14 ensures that a layout pitch between the subsidiary sense-amplifiers 51 can be made four times smaller than the same in the above-mentioned second embodiment.

An operation of the semiconductor memory device in accordance with the third embodiment is explained hereinbelow with reference to FIGS. 15 and 16.

Figure 15:
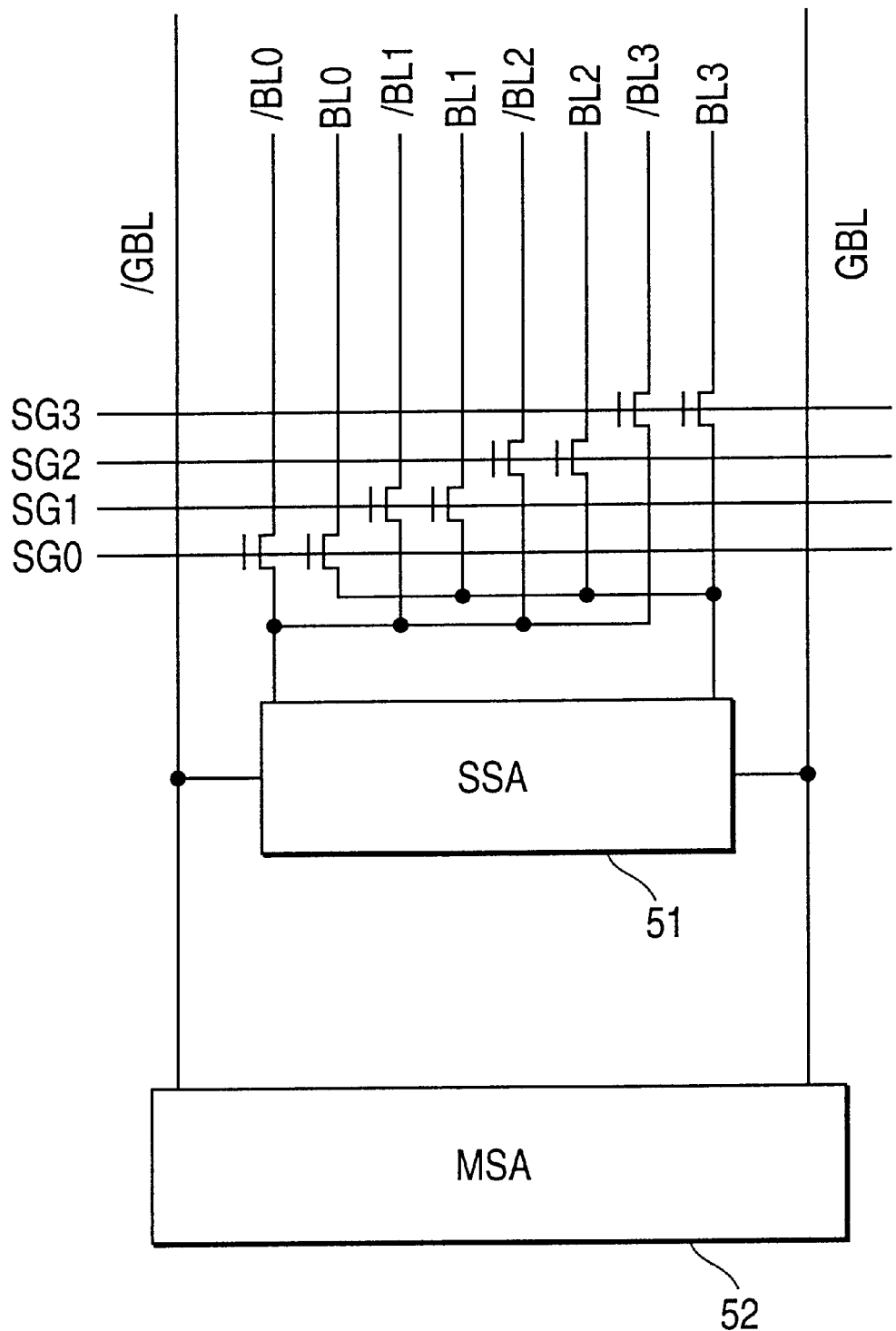
FIG. 15 is a circuit diagram of a semiconductor memory device in accordance with the third embodiment of the present invention.
Figure 16:
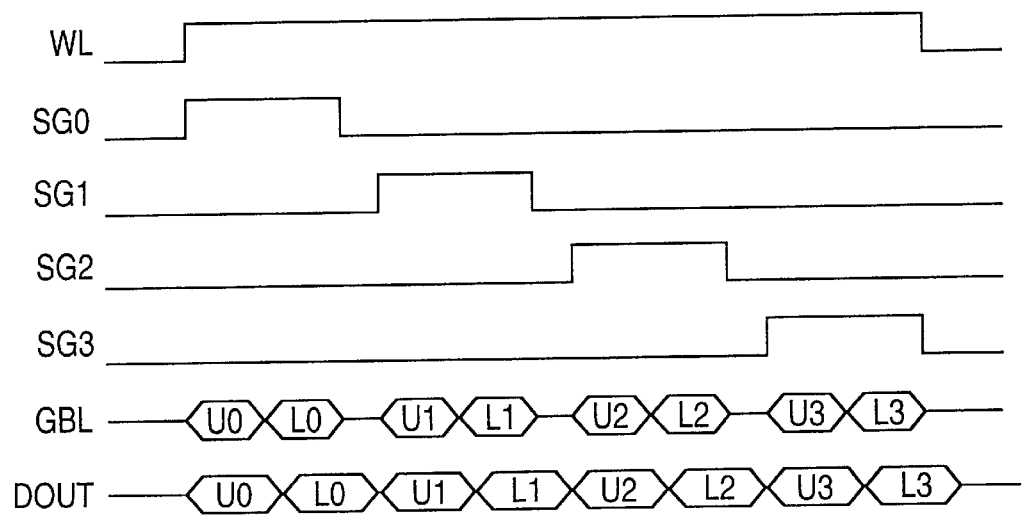
FIG. 16 illustrates waveforms of input timing signals in the circuit illustrated in FIG. 15.

When a signal SG0 for controlling both a word line WL and a transfer gate is risen up to H level, as illustrated in FIG. 16, data stored in a memory cell selected with the word line WL is read out to BL0, BL1, BL2 and BL3 illustrated in FIG. 15. Since only the signal SG0 is at H level among the signals SG0 to SG3, a differential voltage having been read to the subsidiary bit line BL0 is transferred to a bit line running in the subsidiary sense-amplifier 51.

Then, data having been read to the subsidiary bit line BL0 is transferred to a master sense-amplifier 52 in order of upper-bit data (U0) and then lower-bit data (L0) in the same steps as those of the second embodiment. Thus, data is rewritten to the subsidiary bit line BL0. Thereafter, the control signal SG0 is fallen down to L level, to thereby separate the subsidiary bit line BL0 away from the subsidiary sense-amplifier 51.

Then, the signal SG1 for controlling a transfer gate is risen up to H level, to thereby transfer the differential voltage having been read to the subsidiary bit line BL1 to the bit line running in the subsidiary sense-amplifier 51.

Subsequently, data having been read to the subsidiary bit line BL1 in the same way as mentioned above is transferred to the master sense-amplifier 52 in order of upper-bit data (U1) and lower-bit data (L1). Thus, data is rewritten to the subsidiary bit line BL1. Thereafter, the control signal SG1 is fallen down to L level.

Then, the transfer gate control signal SG2 is risen up for reading and rewriting upper-bit data (U2) and lower-bit data (L2) of the subsidiary bit line BL2, followed by rising up the control signal SG3 for reading and rewriting upper-bit data (U3) and lower-bit data (L3) of the subsidiary bit line BL3.

Finally, the word line WL is fallen down to L level. Thus, a cycle of reading operation is completed.

As explained so far, totally eight-bit data, U0, L0, U1, L1, U2, L2, U3 and L3, is successively read out from four memory cells in a single reading cycle.

Figure 17:
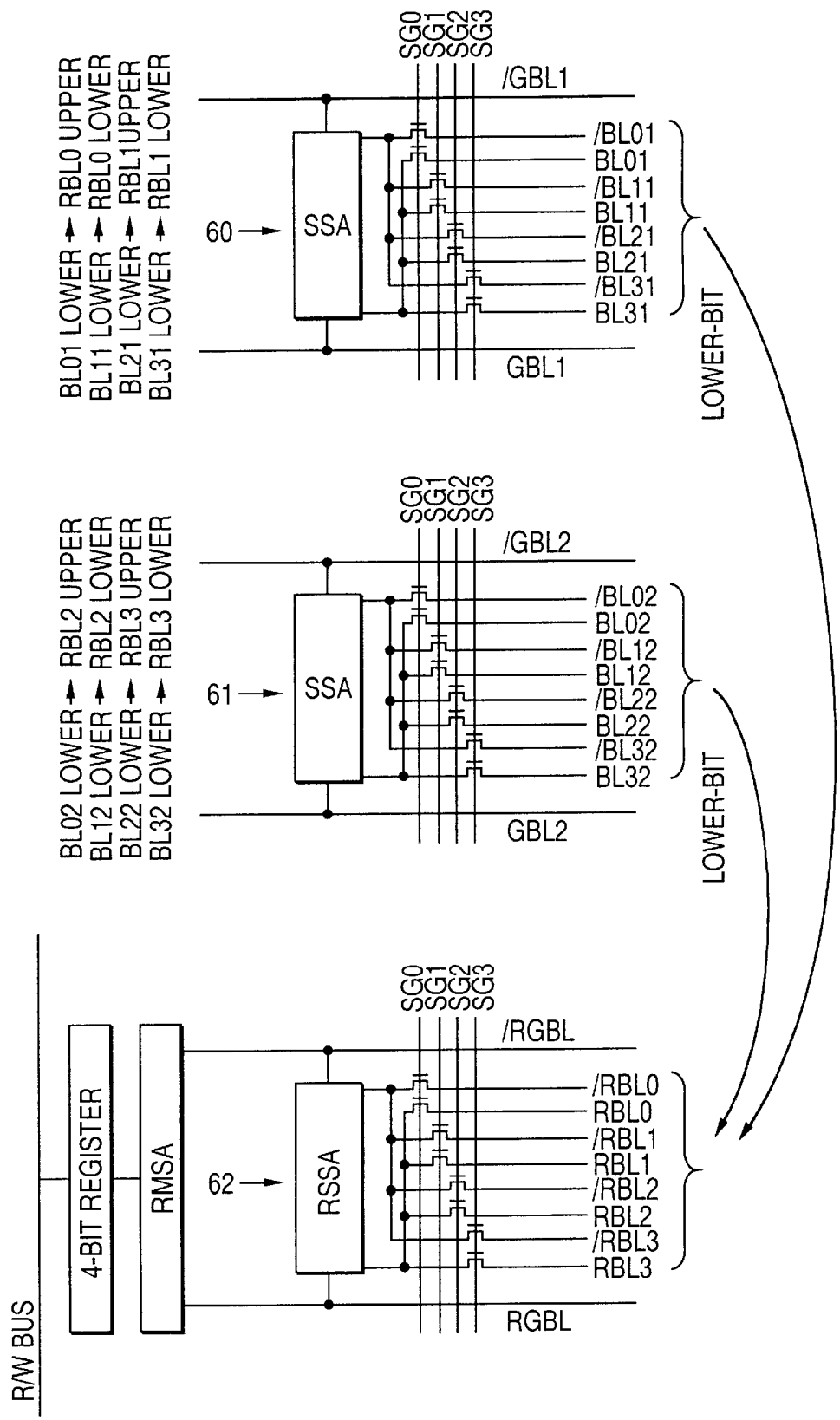
FIG. 17 is a circuit diagram of a semiconductor memory device in accordance with the fourth embodiment of the present invention.
Figure 18:
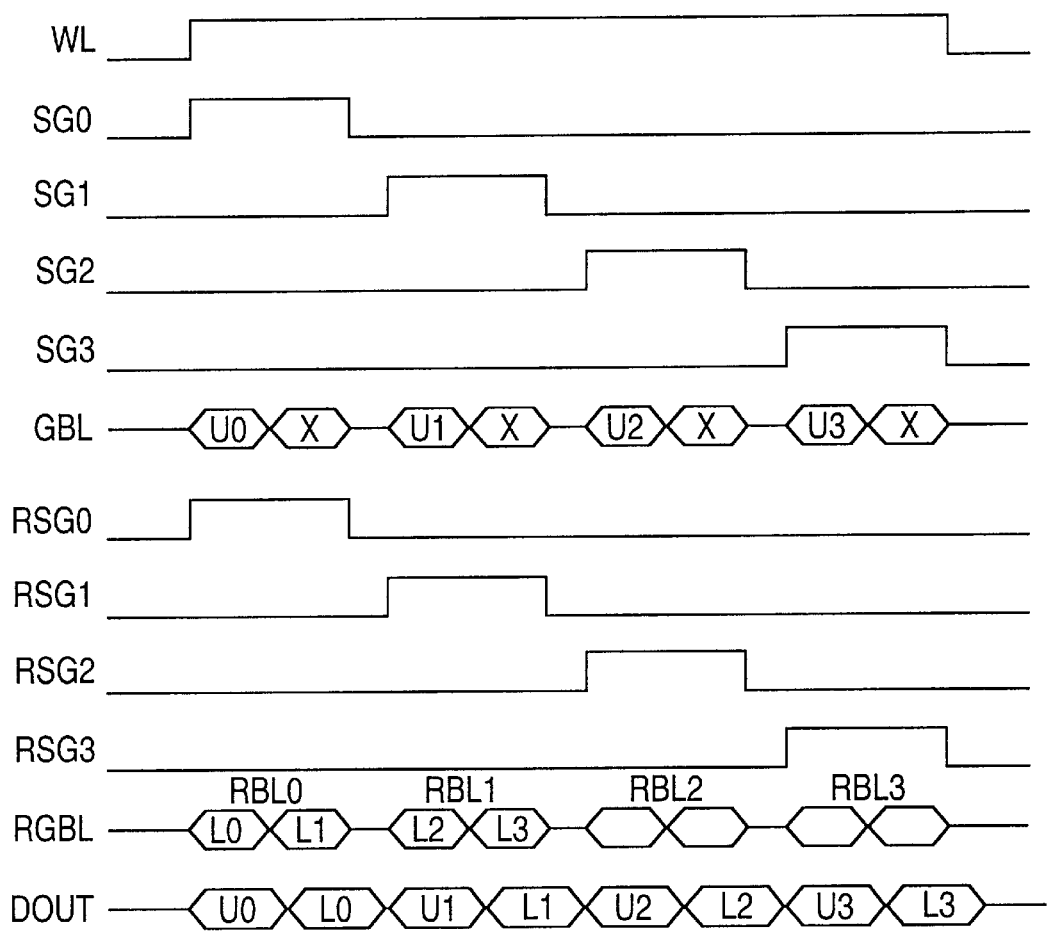
FIG. 18 illustrates waveforms of input timing signals in the circuit illustrated in FIG. 17.
Figure 19:
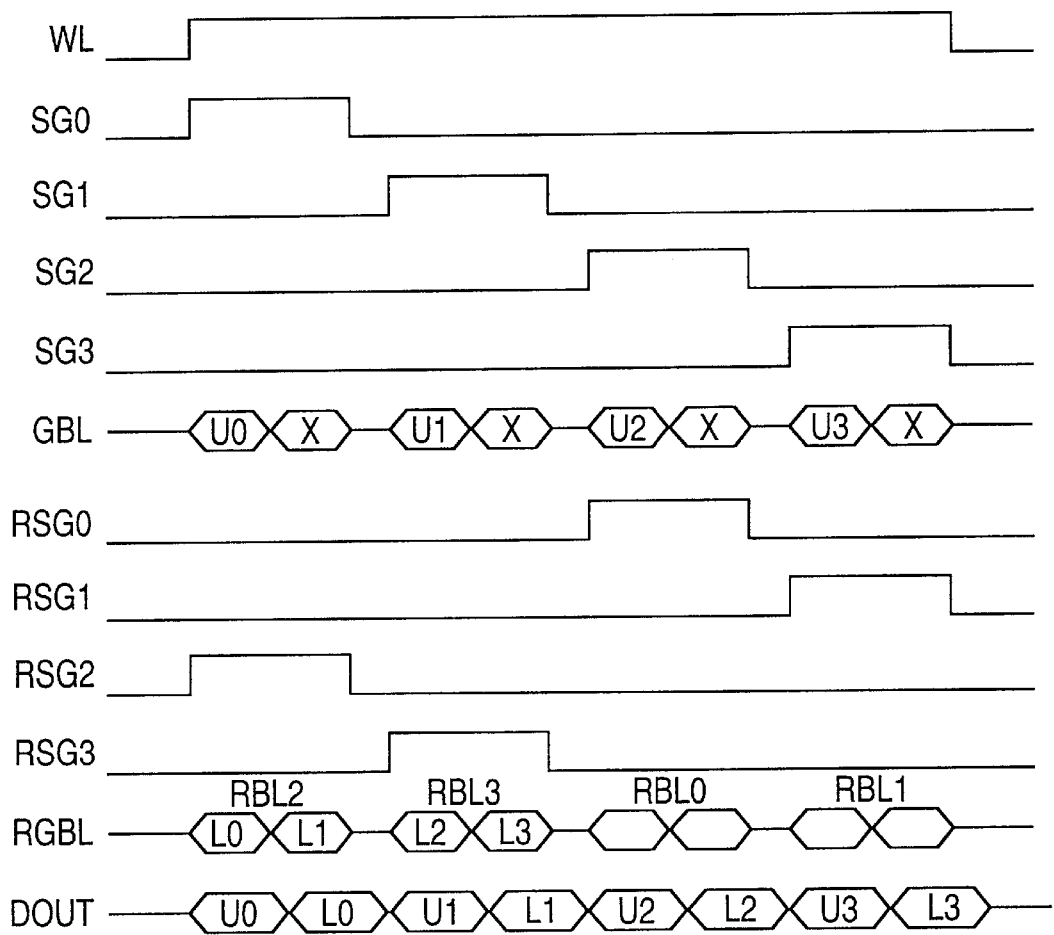
FIG. 19 illustrates waveforms of input timing signals in the circuit illustrated in FIG. 17.

FIG. 17 illustrates a circuit constituting a dynamic type semiconductor memory device in accordance with the fourth embodiment, and FIGS. 18 and 19 illustrate waveforms of input timing signals in the circuit illustrated in FIG. 17.

In recent years, with a dynamic type semiconductor memory device being fabricated in larger integration and higher capacity, it is indispensable to develop redundancy technique using a redundancy array for the purpose of enhancing a fabrication yield. When there is found defectiveness in a certain sense-amplifier, it is replaced with a redundancy memory cell array and a redundancy sense-amplifier both having been in advance prepared for replacement, to thereby remove the defectiveness, and enhance a yield.

The multi-valued subsidiary sense-amplifiers in accordance with the above-mentioned first, second and third embodiments include capacitors therein for conducting feed-back. Hence, if there is a dispersion in a capacity of the capacitors, lower-bit data may be inaccurately read out, resulting in a defective sense-amplifier. On the other hand, upper-bit data is read out in no dependence on a capacity of a capacitor. That is, if there is dispersion in a capacity of a capacitor, only upper-bit data can be accurately read out.

With reference to FIG. 17, subsidiary sense-amplifiers 60 and 61 have defectiveness, and hence, can normally read and write upper-bit data, but cannot read and write lower-bit data, as mentioned earlier. A redundancy subsidiary sense-amplifier 62 has the same structure as that of an ordinary subsidiary sense-amplifier.

Replacement of a defective subsidiary sense-amplifier is explained hereinbelow with reference to FIG. 17. As illustrated in FIG. 17, lower-bit data (totally four-bit) of the subsidiary bit lines BL01, BL11, BL21 and BL31 of the defective subsidiary sense-amplifier 60, which generate defectiveness when read or written, is replaced with upper- and lower-bit data, totally four-bit data, of subsidiary bit lines RBL0 and RBL1 of the redundancy subsidiary sense-amplifier 62. Similarly, lower-bit data (totally four-bit) of the subsidiary bit lines BL02, BL12, BL22 and BL32 of the defective subsidiary sense-amplifier 61, which generate defectiveness when read or written, is replaced with upper- and lower-bit data, totally four-bit data, of subsidiary bit lines RBL2 and RBL3 of the redundancy subsidiary sense-amplifier 62.

The replacement explained above may be conducted by breaking a fuse of another circuit (not illustrated) prepared for replacement.

A reading operation accomplished when the above-mentioned redundancy replacement is carried out is explained hereinbelow with reference to FIGS. 17, 18 and 19.

With reference to FIG. 17, when data is read out of the defective subsidiary sense-amplifier 60, signals RSG0, RSG1, RSG2 and RSG3 for controlling a transfer gate in the redundancy subsidiary sense-amplifier 62 are activated in such order as illustrated in FIG. 18, and data read out to the subsidiary bit lines RBL0, RBL1, RBL2 and RBL3 associated with the control signals RSG0, RSG1, RSG2 and RSG3, respectively, is successively subject to reading and rewriting operation.

Lower- and upper-bit data of the subsidiary bit lines RBL0 and RBL1, totally four-bit data, in the redundancy subsidiary sense-amplifier 62 correspond to lower-bit data (totally four-bit data) of the defective subsidiary sense-amplifier 60. Hence, the lower- and upper-bit data of the subsidiary bit lines RBL0 and RBL1 are retained in a four-bit register 63, and then, transferred to data bus DOUT at a timing illustrated in FIG. 18. Thus, eight-bit data is read out in desired order.

When data is read out of the defective subsidiary sense-amplifier 61, the control signals RSG0, RSG1, RSG2 and RSG3 in the redundancy subsidiary sense-amplifier 62 are activated in such order as illustrated in FIG. 19, and data read out to the subsidiary bit lines RBL2, RBL3, RBL0 and RBL1 associated with the control signals RSG0, RSG1, RSG2 and RSG3, respectively, is successively subject to reading and rewriting operation.

Lower- and upper-bit data of the subsidiary bit lines RBL2 and RBL3, totally four-bit data, in the redundancy subsidiary sense-amplifier 62 correspond to lower-bit data (totally four-bit data) of the defective subsidiary sense-amplifier 61. Hence, the lower- and upper-bit data of the subsidiary bit lines RBL2 and RBL3 are retained in the four-bit register 63, and then, transferred to the data bus DOUT at a timing illustrated in FIG. 19. Thus, eight-bit data can be read out in desired order.

A dynamic type semiconductor memory device in accordance with the fifth embodiment is explained hereinbelow with reference to FIGS. 20 and 21.

The multi-valued subsidiary sense-amplifiers in accordance with the above-mentioned first to fourth embodiments include capacitors therein for conducting feed-back. A dispersion in a capacity of the capacitors might be generated while being fabricated. The fifth embodiment compensates for such a dispersion.

Figure 20:
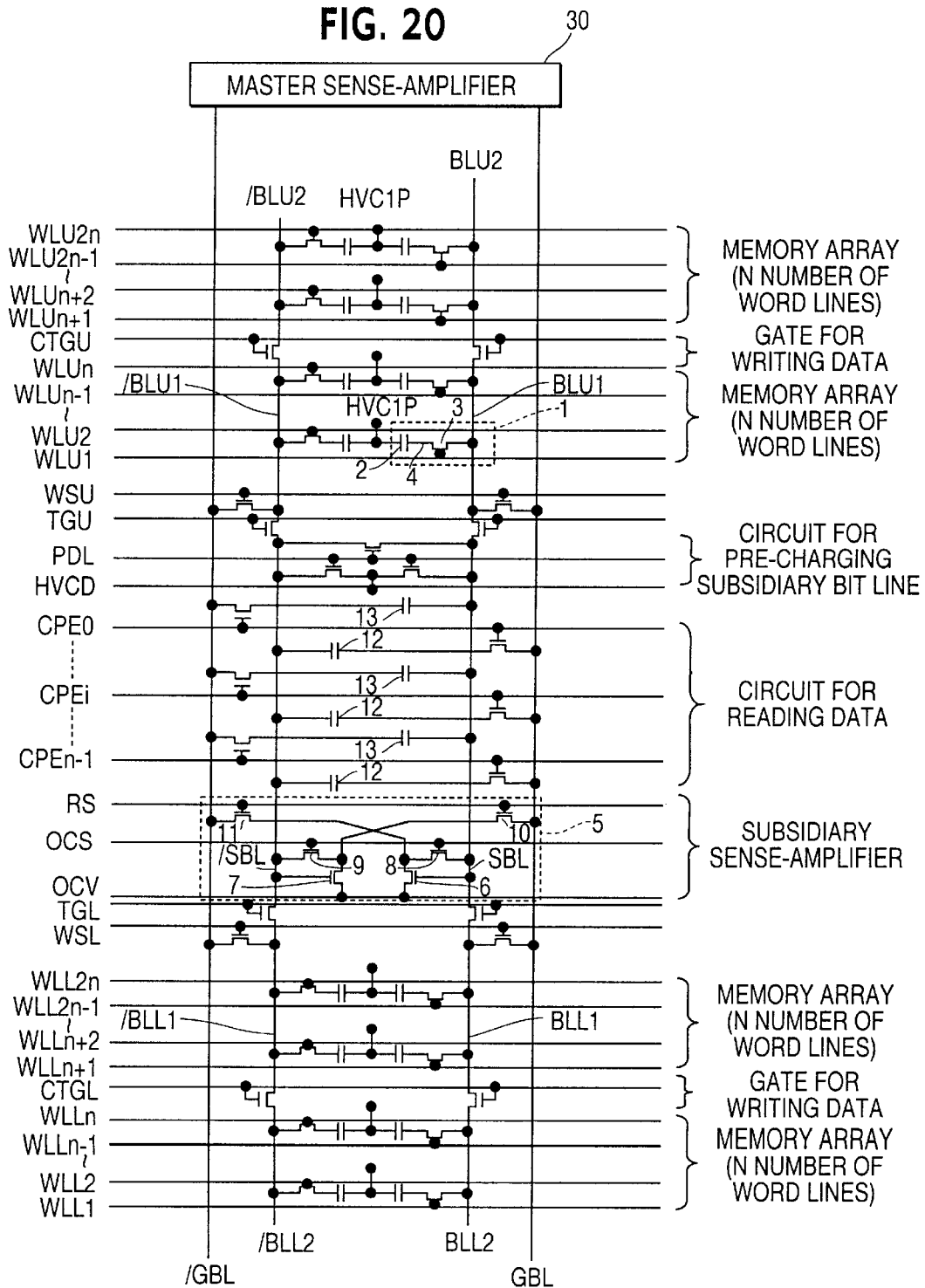
FIG. 20 is a circuit diagram of a semiconductor memory device in accordance with the fifth embodiment of the present invention.

As illustrated in FIG. 20, N kinds of capacities $CC_0$ to $CC_{N-1}$ are connected in series to the transfer gates between the principal bit line pair and the subsidiary bit line pair, wherein N is an integer equal to or greater than 2. The capacitors $CC_0$ to $CC_{N-1}$ are designed to have different storage capacities having a distribution around the storage capacity calculated from the above-mentioned equation (4).

$$CC=CS/3$$

Figure 21:
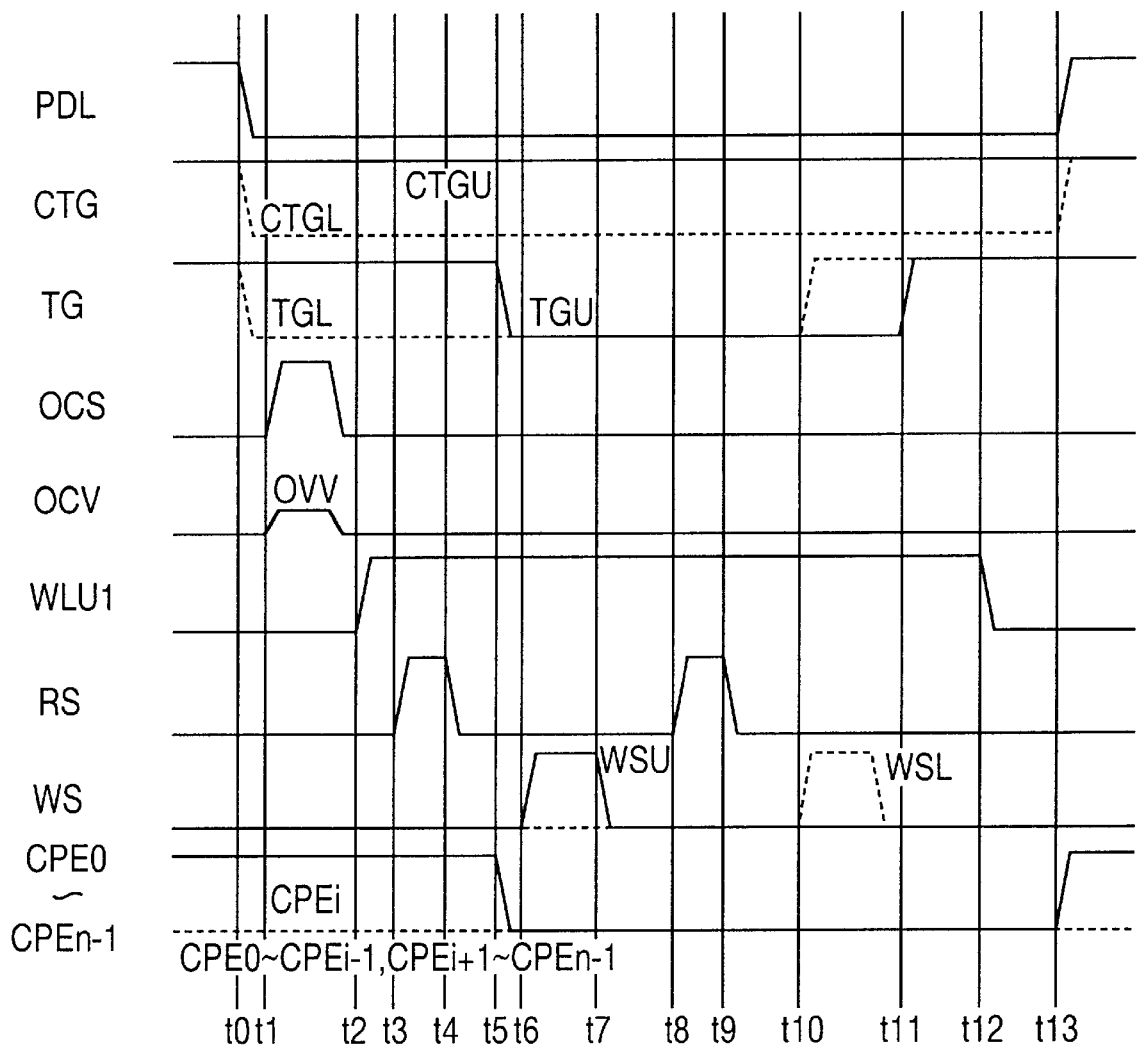
FIG. 21 illustrates waveforms of input timing signals in the circuit illustrated in FIG. 20.

As illustrated in FIG. 21, a control signal CPEi is activated out of the N number of capacitor control signals $CPE_0$ to $CPE_{N-1}$ when a memory cell is to be operated, to thereby make it possible to select a capacitor having an optimal value for feed-back.

While the present invention has been explained in connection with the preferred embodiments, the present invention provides various advantages as follows.

The present invention makes it possible to retain two-bit data in a single memory cell without employing such a memory cell structure as a conventional one including two transistors and one capacitor, but with a memory cell structure including one transistor and one capacitor, which is the same structure as a structure of a general dynamic type semiconductor memory device. Thus, the present invention remarkably contributes to reduction in a chip area.

Since the present invention employs hierarchized bit lines, it is possible to read or write a lot of data at a time, which is suitable for a high-speed file memory.

In addition, by replacing only defective lower-bit data of a defective subsidiary sense-amplifier with a redundancy sense-amplifier, it is possible to minimize an increase in a redundancy section area, and enhance a yield.

In accordance with the preferred embodiments, a plurality of capacitors having different capacities in a subsidiary sense-amplifier, which suppresses reduction in an operation margin in the case that capacities of capacitors fluctuate due to a dispersion which is generated while a memory device is being fabricated.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-264074 filed on Sep. 29, 1997 including specification, claims, drawings and summary is incorporated herein by reference in its entirety.

What is claimed is:

1. A dynamic type semiconductor memory device comprising:
   (a) a first hierarchized complementary bit line pair;
   (b) a second hierarchized complementary bit line pair;
   (c) a first sense-amplifier electrically connected to said first bit line;
   (d) at least one second sense-amplifier that is electrically connected to both a line of said first bit line pair and a line of said second bit line pair;
   (e) a capacitor that is located between said first and second bit line pairs for each of said second sense-amplifiers; and
   (f) a transfer gate that is arranged in series with said capacitor between said first and second bit line pairs.

2. The dynamic type semiconductor memory device as set forth in claim 1, wherein
   said capacitor is electrically connected at one end thereof to a line of said second bit line pair, and
   further electrically connected at the other end thereof to one of a pair of signal terminals of said transfer gate, and
   electrically connected at the other of said pair of signal terminals to a line of said first bit line pair.

3. The dynamic type semiconductor memory device as set forth in claim 1, wherein
   each of said second and first sense-amplifiers is successively activated twice, wherein
   a first voltage amplified in said first bit line at a first time is transferred to said second bit line through said capacitor and said transfer gate, and wherein
   a differential voltage read out of a selected memory cell onto said second bit line is amplified up to a second voltage that is different from said first voltage, said second voltage thereby activating said first sense-amplifier at a second time.

4. The dynamic type semiconductor memory device as set forth in claim 1, further comprising a second transfer gate located between said second bit line for dividing said second bit line into a first and second section, and wherein different voltages are written into a first and second section of said second bit line, and wherein said second transfer gate is activated to thereby generate four different voltages, wherein each of said four different voltages is written into a plurality of respective memory cells.

5. A memory device as recited in claim 4, wherein said four different voltages correspond to a two-bit binary numeral.

6. A memory device as recited in claim 4, wherein said four different voltages correspond to 11, 10, 01, and 00 in a two-bit binary numeral, respectively.

7. A memory device as recited in claim 4, wherein said four different voltages comprise a source voltage Vcc, a ⅔ Vcc, a ⅓ Vcc, and a ground voltage.

8. A dynamic type semiconductor memory device comprising:

(a) a hierarchical bit line including a complementary principal bit line pair and subsidiary bit line pair;

(b) a capacitor located between said principal bit line pair and said subsidiary bit line pair electrically connected to a subsidiary sense-amplifier; and (c) a transfer gate electrically connected in series to said capacitor between said principal bit line pair and said subsidiary bit line pair wherein said transfer gate is not primarily utilized as a storage memory cell, wherein a differential voltage read out to said subsidiary bit line pair from a selected memory cell is transferred to said principal bit line pair, and is amplified by a master sense-amplifier electrically connected to said principal bit line pair, and data on said principal bit line pair is fed-back to said principal bit line pair through said capacitor, and read out again to said principal bit line pair from said subsidiary bit line pair, to thereby read out two-bit data.

9. The dynamic type semiconductor memory device as set forth in claim 8, further comprising a second transfer gate/ dividing said subsidiary bit line pair into a first and second sections, and wherein a certain combination of voltages is written into said first and second sections of said subsidiary bit line pair, and then, said second transfer gate is activated to thereby write four different voltages into said memory cell.

10. The dynamic type semiconductor memory device as set forth in claim 9, further comprising a third transfer gate located between a plurality of said subsidiary bit line pairs and said subsidiary sense-amplifier, and wherein each of said subsidiary bit line pairs and said subsidiary sense-amplifier are in communication with each other through said third transfer gate in time-sharing to thereby successively read out data.

11. The dynamic type semiconductor memory device as set forth in claim 10, wherein if one-bit data out of two-bit data read out by said subsidiary sense-amplifier is defective, said one-bit data is replaced with a subsidiary sense-amplifier prepared for compensating for defectiveness.

12. The dynamic type semiconductor memory device as set forth in claim 11, wherein replacement of said one-bit data is conducted by breaking a fuse of a circuit prepared for replacement.

13. The dynamic type semiconductor memory device as set forth in claim 11, wherein said subsidiary sense-amplifier prepared for compensating for defectiveness is a redundancy subsidiary sense-amplifier.

14. The dynamic type semiconductor memory device as set forth in claim 8, wherein N pairs of a capacitor and a transfer gate are connected in parallel between said principal bit line pair and said subsidiary bit line pair, said capacitor being electrically connected in series to said transfer gate in each of said N pairs, wherein N is an integer equal to or greater than 2.

15. A memory device as recited in claim 8, wherein said two-bit data corresponds to four different voltages.

16. A memory device as recited in claim 15, wherein said four different voltages correspond to 11, 10, 01, and 00 in a two-bit binary numeral, respectively.

17. A memory device as recited in claim 15, wherein said four different voltages comprise a source voltage Vcc, a ⅔ Vcc, a ⅓ Vcc, and a ground voltage.

18. A method of reading data out of a dynamic type semiconductor memory device including a first sense amplifier having a principal bit line pair and a subsidiary bit line pair, and a capacitor located between a line of said principal bit line and a line of said subsidiary bit line, said method comprising the steps of:

(a) transferring a differential voltage, that has been read out of a selected memory onto said subsidiary bit line, to said principal bit line;

(b) amplifying said differential voltage to thereby read out an upper bit;

(c) feeding data running on said principal bit line back to said subsidiary bit line through said capacitor; and (d) reading data from said subsidiary bit line to said principal bit line to thereby read out a lower bit.

19. The method as set forth in claim 18, further comprising the steps of:

(e) dividing said subsidiary bit line into first and second sections by utilizing a a transfer gate;

(f) writing different voltages into said first and second sections of said subsidiary bit line; and (g) activating said transfer gate to thereby generate four different voltages by distribution of electric charges, each of said different voltages being written into a memory cell.

20. A method as recited in claim 18, wherein said upper and lower bits comprise a two-bit binary numeral that corresponds to a plurality of differential voltages.

21. A method as recited in claim 20, wherein said plurality of differential voltages comprise four different voltages that correspond to 11, 10, 01, and 00 in said two-bit binary numeral, respectively.

22. A method as recited in claim 21, wherein said four different voltages comprise a source voltage Vcc, a ⅔ Vcc, a ⅓ Vcc, and a ground voltage.

* * * * *